US 11,367,776 B2

(12) United States Patent
Lee et al.

(10) Patent No.: US 11,367,776 B2
(45) Date of Patent: Jun. 21, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Kwang-Young Lee, Seongnam-si (KR); Jin Wook Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 39 days.

(21) Appl. No.: 16/836,428

(22) Filed: Mar. 31, 2020

(65) Prior Publication Data

US 2021/0066453 A1 Mar. 4, 2021

(30) Foreign Application Priority Data

Aug. 30, 2019 (KR) .................. 10-2019-0106973

(51) Int. Cl.
| | |
|---|---|
| *H01L 29/06* | (2006.01) |
| *H01L 29/78* | (2006.01) |
| *H01L 29/66* | (2006.01) |
| *H01L 29/417* | (2006.01) |
| *H01L 21/768* | (2006.01) |
| *H01L 21/8234* | (2006.01) |

(52) U.S. Cl.
CPC .... *H01L 29/0669* (2013.01); *H01L 21/76895* (2013.01); *H01L 21/823475* (2013.01); *H01L 29/41791* (2013.01); *H01L 29/66795* (2013.01); *H01L 29/785* (2013.01)

(58) Field of Classification Search
CPC .............. H01L 29/41791; H01L 21/823475
See application file for complete search history.

(56) References Cited

U.S. PATENT DOCUMENTS

| | | | | |
|---|---|---|---|---|
| 5,849,635 | A | * | 12/1998 | Akram ............. H01L 21/02164 438/704 |
| 9,536,968 | B2 | | 1/2017 | Park et al. |
| 9,685,340 | B2 | | 6/2017 | Ok et al. |
| 9,685,555 | B2 | | 6/2017 | Liu et al. |
| 9,691,897 | B2 | | 6/2017 | Xie et al. |
| 9,960,241 | B2 | | 5/2018 | Park et al. |
| 10,128,187 | B2 | * | 11/2018 | Zang ................... H01L 23/66 |
| 2017/0345904 | A1 | * | 11/2017 | Clark .................. H01L 29/161 |
| 2019/0035676 | A1 | * | 1/2019 | Yang ................... H01L 21/263 |
| 2020/0035549 | A1 | * | 1/2020 | Wu ..................... H01L 21/3086 |

FOREIGN PATENT DOCUMENTS

KR 10-019093 1/1999

* cited by examiner

*Primary Examiner* — Farun Lu
(74) *Attorney, Agent, or Firm* — F. Chau & Associates, LLC

(57) ABSTRACT

A semiconductor device includes a source/drain pattern disposed on a substrate and a source/drain contact connected to the source/drain pattern. The source/drain contact includes a lower contact structure extending in a first direction and an upper contact structure protruding from the lower contact structure. The upper contact structure includes a first sidewall and a second sidewall facing away from each other in the first direction. The first sidewall of the upper contact structure includes a plurality of first sub-sidewalls, and each of the first sub-sidewalls includes a concave surface.

12 Claims, 36 Drawing Sheets

SEMICONDUCTOR DEVICE AND METHOD OF FABRICATING THE SAME

CROSS-REFERENCE TO RELATED APPLICATION

This application claims the benefit of Korean Patent Application No. 10-2019-0106973, filed on Aug. 30, 2019, in the Korean Intellectual Property Office, the disclosure of which is incorporated by reference herein in its entirety.

TECHNICAL FIELD

The present disclosure relates to semiconductors and, more particularly, to a semiconductor device and a method of fabricating the same.

DISCUSSION OF THE RELATED ART

There is a trend to make semiconductors more highly integrated while being less expensive to fabricate. These highly integrated semiconductors fit a larger number of structures into a smaller size, thereby shrinking the pitch of the device.

SUMMARY

A semiconductor device includes a source/drain pattern which is disposed on a substrate and a source/drain contact which is connected to the source/drain pattern. The source/drain contact includes a lower contact structure extending in a first direction and an upper contact structure protruding from the lower contact structure. The upper contact structure includes a first sidewall and a second sidewall facing away from each other in the first direction. The first sidewall of the upper contact structure includes a plurality of first sub-sidewalls, and each of the first sub-sidewalls has a concave surface.

Ac semiconductor device includes a substrate that has an active area and a field area. At least one active pattern protrudes from the substrate in the active area and is extend in a first direction. A gate electrode intersects the active patterns in the active area and extends in a second direction. A source/drain pattern is disposed on the active pattern. A gate contact is connected to the gate electrode and a source/drain contact is connected to the source/drain pattern. A portion of the gate electrode extends to the field area. At least a portion of the gate contact is disposed on the active area. The source/drain contact includes a lower contact structure extending in the first direction and an upper contact structure protruding from the lower contact structure. The upper contact structure includes a first sidewall and a second sidewall facing away from each other in the second direction. The upper contact structure includes at least one apex part protruding in the second direction. Each of the apex parts is defined where adjacent curved surfaces meet.

A semiconductor device includes a source/drain pattern which is disposed on a substrate. A source/drain contact is connected to the source/drain pattern and includes a lower contact structure and an upper contact structure protruding from the lower contact structure and including a first sidewall and a second sidewall facing away from each other and a contact insulating liner which extends along the first sidewall of the upper contact structure and the second sidewall of the upper contact structure. Each of the first sidewall of the upper contact structure and the second sidewall of the upper contact structure includes a plurality of sub-sidewalls, and each of the sub-sidewalls has a concave surface.

A method of fabricating a semiconductor device includes forming a source/drain contact which is connected to a source/drain pattern in an interlayer insulating film. A mask pattern which exposes a portion of the source/drain contact is formed on the source/drain pattern. A first sub-recess is formed by removing a portion of the source/drain contact using the mask pattern. A first sub-insulating liner is formed along sidewalls and a bottom surface of the first sub-recess. A first insulating liner pattern is formed on a sidewall of the first sub-recess defined by the source/drain contact by anisotropically etching the first sub-insulating liner. A second sub-recess is formed by removing a portion of the source/drain contact using the mask pattern and forming a second sub-insulating liner along sidewalls and a bottom surface of the second sub-recess.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

As described and illustrated herein, a fin field effect transistor (FinFET) including a channel region of a fin pattern shape and a transistor including a nanosheet or nanowires are illustrated by way of example. However, the present invention is not limited to these transistors. The semiconductor devices, according to exemplary embodiments of the present disclosure, may also include a tunneling FET or a three-dimensional (3D) transistor. The semiconductor devices, according to exemplary embodiments of the present disclosure, may also include a planar transistor. In addition, the semiconductor devices, according to exemplary embodiments of the present disclosure, may include a bipolar junction transistor, a lateral double diffusion transistor (LDMOS), or the like.

A semiconductor device, according to exemplary embodiments of the present disclosure, will now be described with reference to FIGS. 1 through 6.

Figure 1:
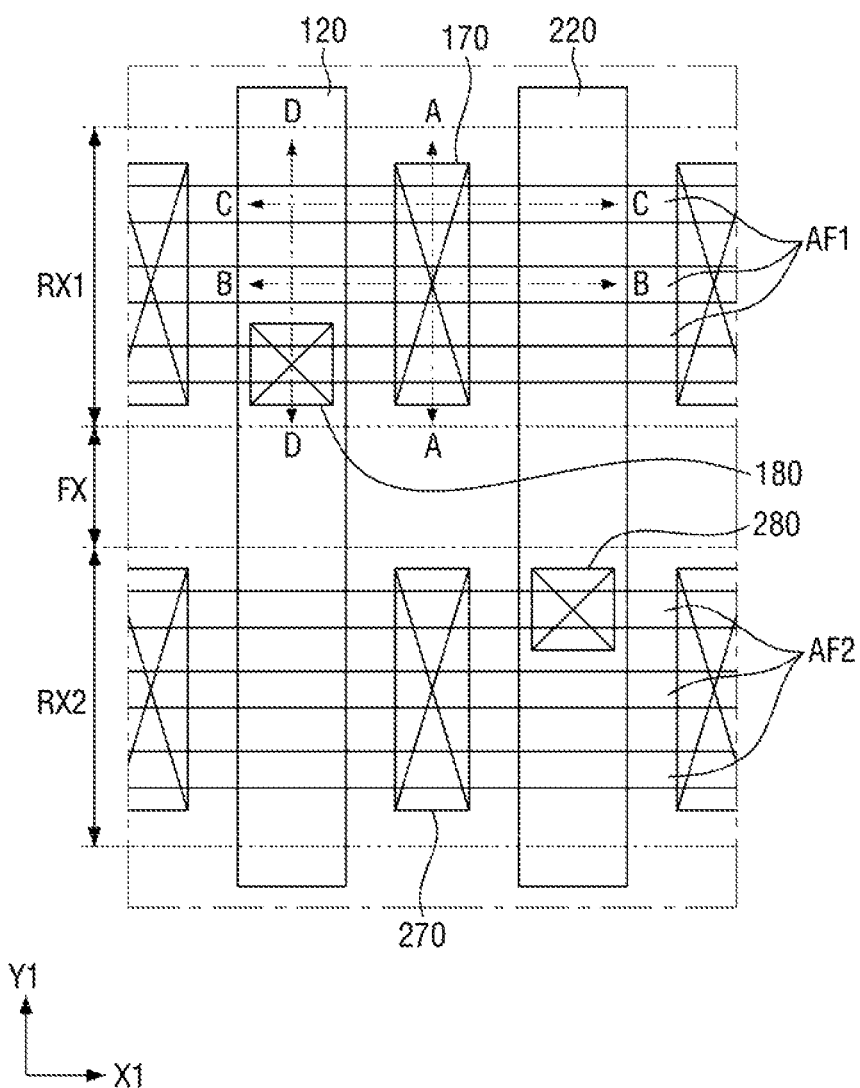
FIG. 1 is a layout view illustrating a semiconductor device according to exemplary embodiments of the present disclosure.
Figure 2:
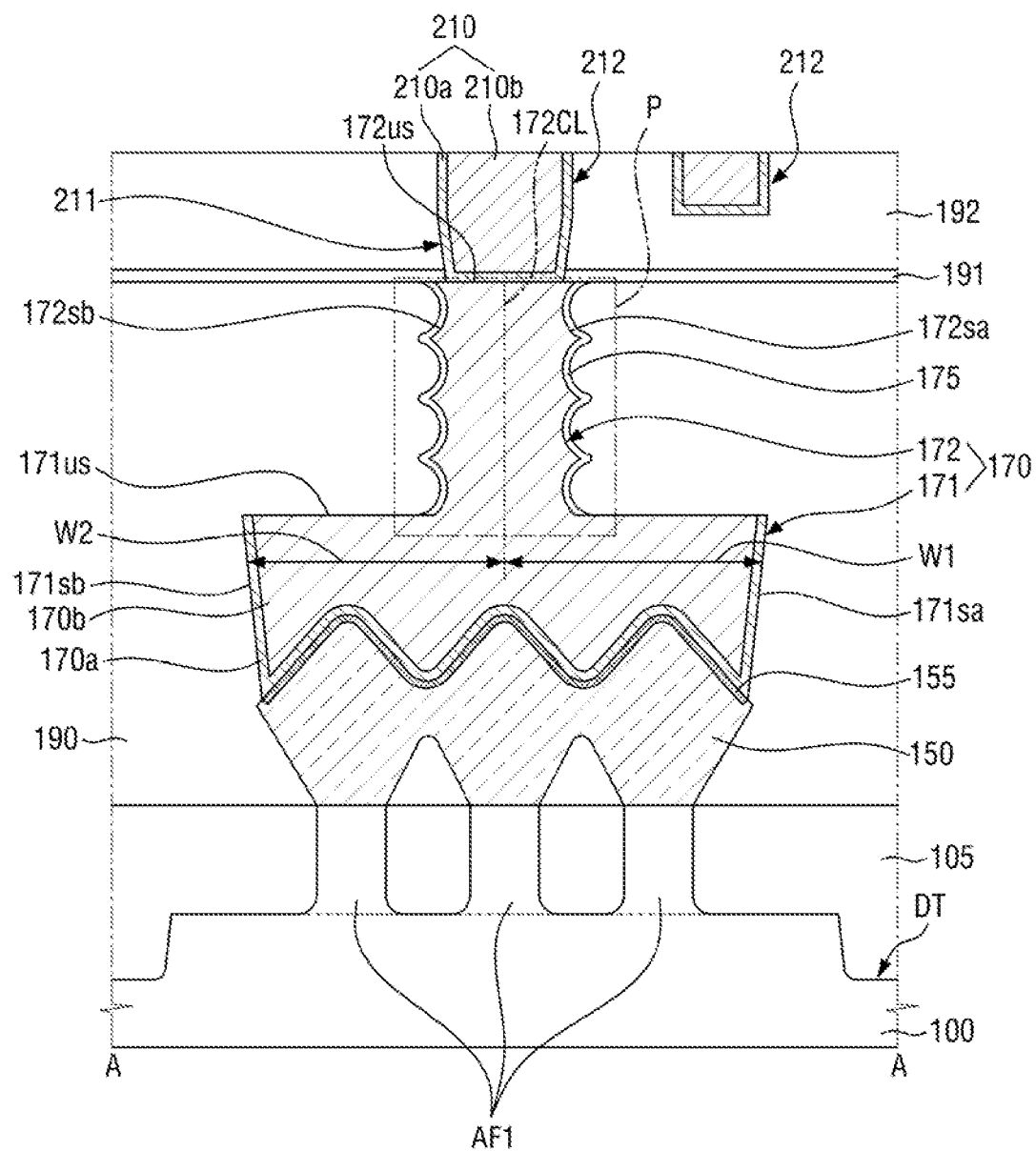
FIG. 2 is a cross-sectional view taken along line A-A of FIG. 1.
Figure 3:
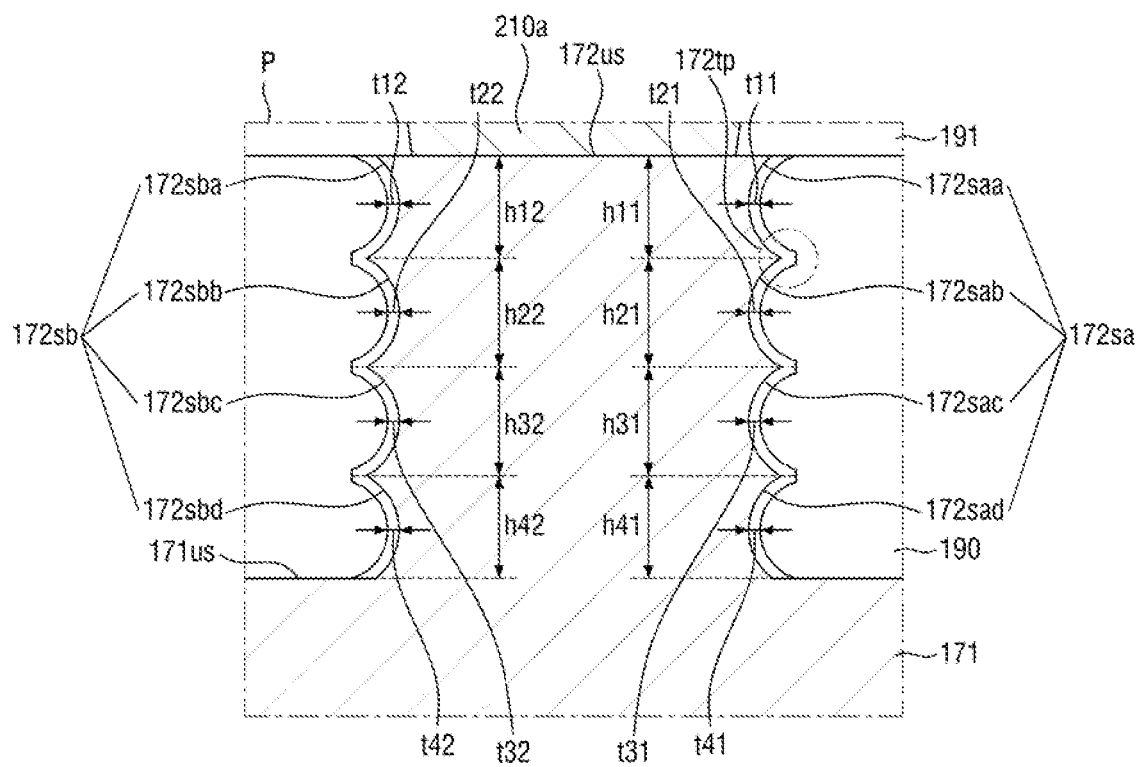
FIG. 3 is an enlarged view of a portion P of FIG. 2.
Figure 4:
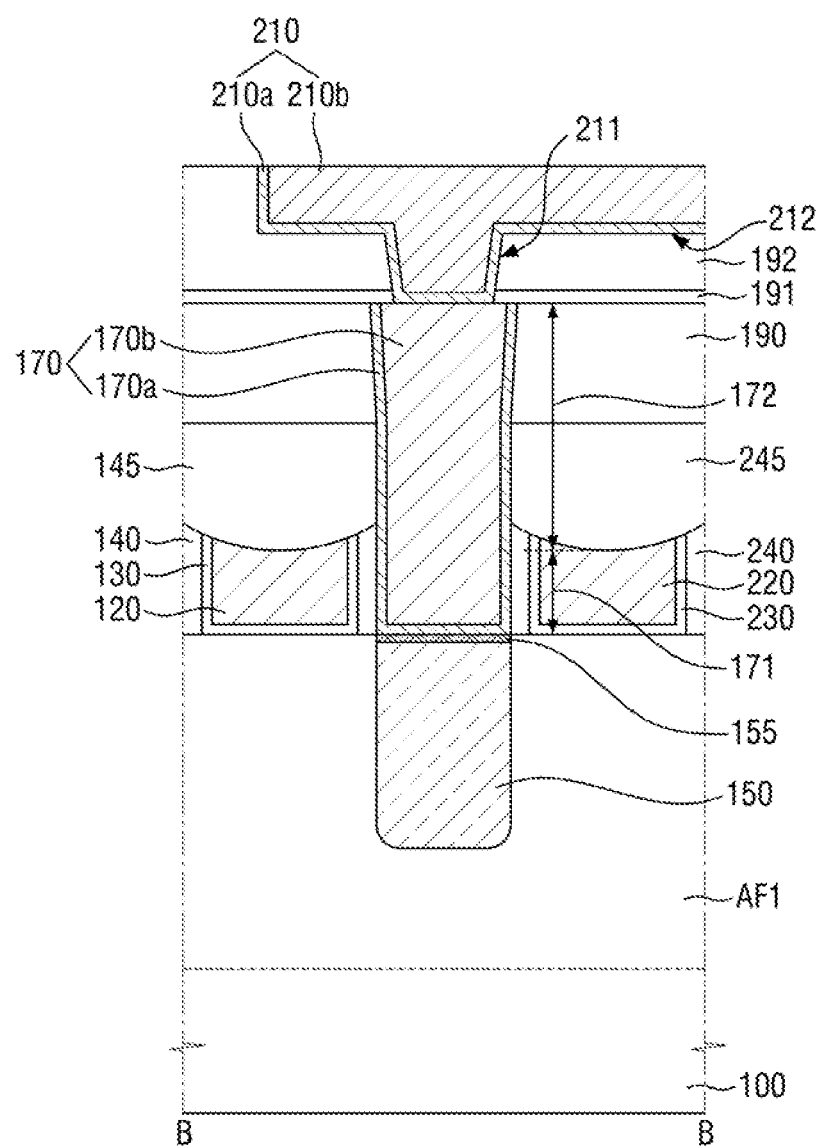
FIGS. 4, 5 and 6 are cross-sectional views taken along lines B-B, C-C and D-D of FIG. 1, respectively.
Figure 5:
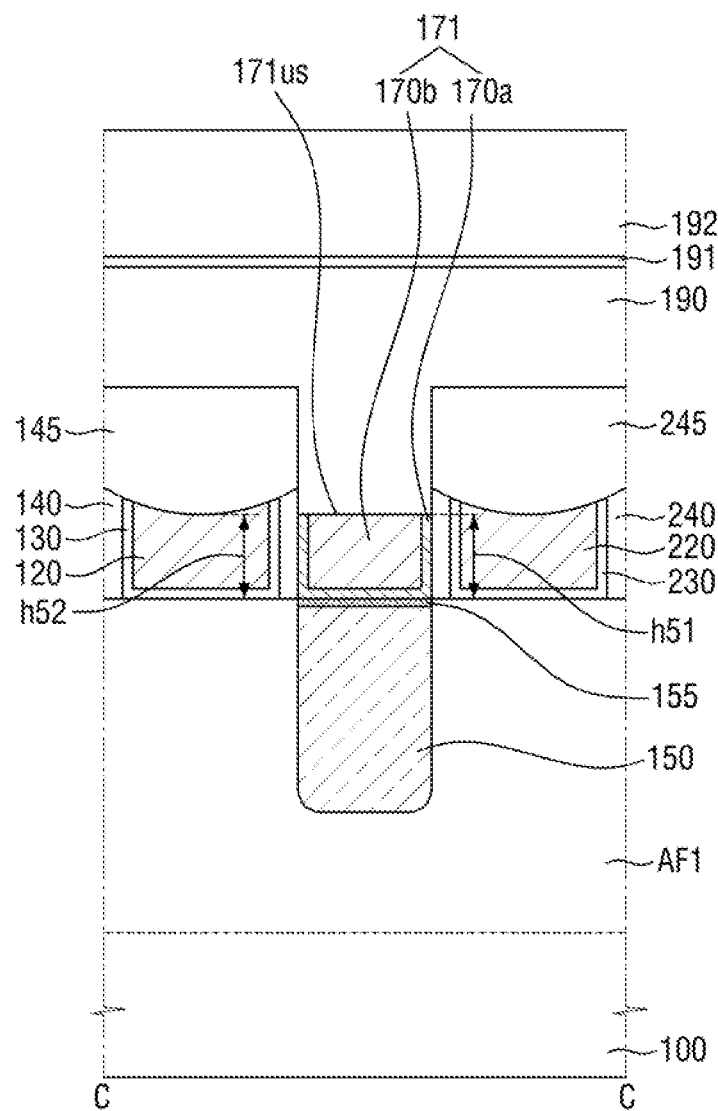
Figure 6:
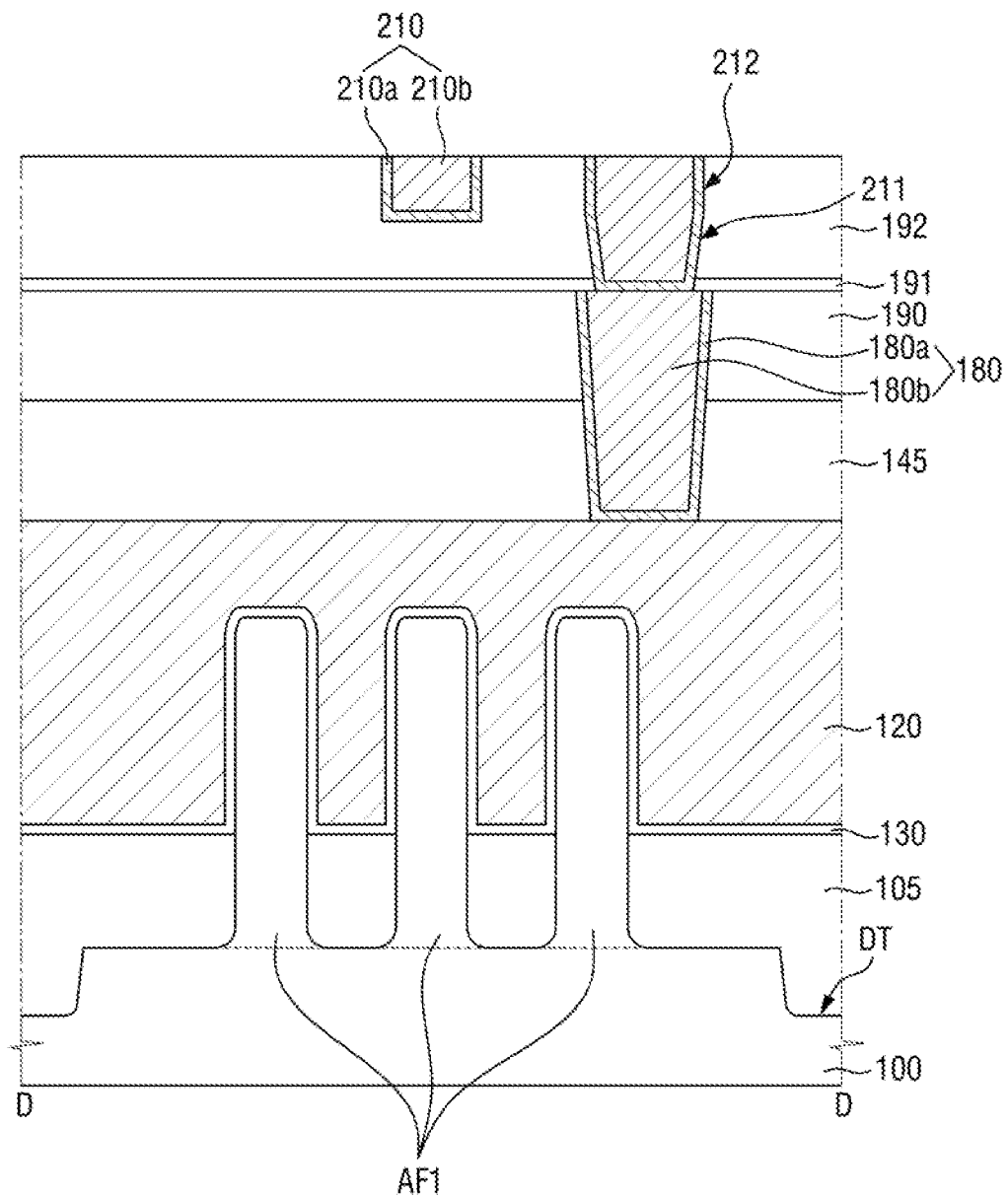

FIG. 1 is a layout view of a semiconductor device according to exemplary embodiments of the present disclosure. FIG. 2 is a cross-sectional view taken along line A-A of FIG. 1. FIG. 3 is an enlarged view of a portion P of FIG. 2. FIGS. 4, 5 and 6 are cross-sectional views taken along lines B-B, C-C and D-D of FIG. 1, respectively. For ease of description, a wiring structure 210 is not illustrated in FIG. 1.

Referring to FIGS. 1 through 6, the semiconductor device, according to exemplary embodiments of the present disclosure, may include at least one first active pattern AF1, at least one second active pattern AF2, a first gate electrode 120, a second gate electrode 220, a first source/drain contact 170, a second source/drain contact 270, a contact insulating liner 175, a first gate contact 180, and a second gate contact 280.

A substrate 100 may include a first active area RX1, a second active area RX2, and a field area FX. The field area FX may be immediately adjacent to the first active area RX1 and the second active area RX2. The field area FX may share a boundary with each of the first active area RX1 and the second active area RX2.

The first active area RX1 and the second active area RX2 are spaced apart from each other. The first active area RX1 and the second active area RX2 may be separated by the field area FX.

For example, the first active area RX1 and the second active area RX2 are spaced apart from each other and may be at least partially surrounded by an element isolation layer. A portion of the element isolation layer is disposed between the first active area RX1 and the second active area RX2, and this portion may be the field area FX. For example, a portion where a channel region of a transistor, which may be an example of the semiconductor device, is formed may be an active area, and a portion that defines the channel region of the transistor formed in the active area may be a field area. Alternatively, the active area may be a portion where a fin pattern or a nanosheet used as a channel region of a transistor is formed, and the field area may be a region where a fin pattern or a nanosheet used as a channel region is not formed.

As illustrated in FIGS. 2 and 6, the field area FX may be defined by a deep trench DT, but the present invention is not limited to this case. Further, those skilled in the art to which the present disclosure pertains can distinguish which portion is a field area and which portion is an active area.

The substrate 100 may be a silicon substrate or a silicon-on-insulator (SOI) substrate. Otherwise, the substrate 100 may include, but is not limited to including, silicon germanium, silicon germanium-on-insulator (SGOI), indium antimonide, lead telluride, indium arsenide, indium phosphide, gallium arsenide, or gallium antimonide.

The first active patterns AF1 may be formed in the first active area RX1. The first active patterns AF1 may protrude from the first active area RX1 of the substrate 100. The first active patterns AF1 may be disposed on the substrate 100 and extend along a first direction X1. The second active patterns AF2 may be formed in the second active area RX2. A description of the second active patterns AF2 may be substantially the same as the description of the first active patterns AF1 and so to the extent that the second active patterns AF2 are not described herein, it may be assumed that they are at least similar to the first active patterns AF1.

In the semiconductor device, according to exemplary embodiments of the present disclosure, each of the first active patterns AF1 may be, for example, a fin pattern. The first active patterns AF1 may be used as channel patterns for transistors. Although three first active patterns AF1 and three second active patterns AF2 are illustrated, this is merely an example used for ease of description, and the present invention is not limited to this example. The number of the first active patterns AF1 and the number of the second active patterns AF2 may each be at least one.

Each of the first active patterns AF1 and the second active patterns AF2 may be a part of the substrate 100 or may include an epitaxial layer grown from the substrate 100. Each of the first active patterns AF1 and the second active patterns AF2 may include an elemental semiconductor material such as silicon or germanium. Alternatively, each of the first active patterns AF1 and the second active patterns AF2 may include a compound semiconductor such as a group IV-IV compound semiconductor or a group III-V compound semiconductor.

The group IV-IV compound semiconductor may be, e.g., a binary or ternary compound including two or more of carbon (C), silicon (Si), germanium (Ge) and tin (Sn) or a compound obtained by doping the binary or ternary compound with a group IV element. The group III-V compound semiconductor may be, e.g., a binary, ternary, or quaternary compound composed of at least one of aluminum (Al), gallium (Ga) and indium (n) (i.e., group III elements) bonded with one of phosphorus (P), arsenic (As) and antimony (Sb)(i.e., group V elements).

A field insulating layer 105 may be formed on the substrate 100. The field insulating layer 105 may be formed over the first active area RX1, the second active area RX2, and the field area FX. The field insulating layer 105 may fill the deep trench DT.

The field insulating layer 105 may be formed on part of sidewalls of the first active patterns AF1 and part of sidewalls of the second active patterns AF2. Each of the first active patterns AF1 and the second active patterns AF2 may protrude above an upper surface of the field insulating layer 105. The field insulating layer 105 may include, for example, an oxide layer, a nitride layer, an oxynitride layer, or a combination of the same.

The first gate electrode 120 and the second gate electrode 220 may extend in a second direction Y1. Each of the first gate electrode 120 and the second gate electrode 220 may be disposed on the first active patterns AF1 and the second active patterns AF2. Each of the first gate electrode 120 and the second gate electrode 220 may intersect the first active patterns AF1 and the second active patterns AF2.

Although each of the first gate electrode 120 and the second gate electrode 220 is illustrated as being disposed over the first active area RX1 and the second active area RX2, this is merely an example used for ease of description, and the present invention is not limited to this example. For example, at least one of the first gate electrode 120 and the second gate electrode 220 may be divided into two parts disposed in the first active area RX1 and the second active area RX2.

The first gate electrode 120 and the second gate electrode 220 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations of the same. Each of the first gate electrode 120 and the second gate electrode 220 may include a conductive metal oxide, a conductive metal oxynitride, or an oxidized form of any one of the above materials.

First gate spacers 140 may be disposed on sidewalls of the first gate electrode 120. Second gate spacers 240 may be disposed on sidewalls of the second gate electrode 220. Each of the first gate spacers 140 and the second gate spacers 240 may extend along the second direction Y1.

Each of the first gate spacers 140 and the second gate spacers 240 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and combinations of the same.

Each of a first gate insulating layer 130 and a second gate insulating layer 230 may be formed on the first active patterns AF1, the second active patterns AF2, and the field insulating layer 105. The first gate insulating layer 130 may be formed between the first gate electrode 120 and the first gate spacers 140. The second gate insulating layer 230 may be formed between the second gate electrode 220 and the second gate spacers 240.

Each of the first gate insulating layer 130 and the second gate insulating layer 230 may be formed along profiles of the first active patterns AF1 and the second active patterns AF2 protruding above the field insulating layer 105 and along the upper surface of the field insulating layer 105. An interfacial layer may be further formed along the profiles of the first active patterns AF1 and the second active patterns AF2, protruding above the field insulating layer 105. Each of the first gate insulating layer 130 and the second gate insulating layer 230 may be formed on the interfacial layer.

Each of the first gate insulating layer 130 and the second gate insulating layer 230 may include silicon oxide, silicon oxynitride, silicon nitride, or a high dielectric constant (high-k) material having a higher dielectric constant than silicon oxide. The high-k material may include one or more of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Shapes of the second gate insulating layer 230 and the second gate electrode 220 may be similar to those of the first gate insulating layer 130 and the first gate electrode 120 illustrated in FIG. 6.

A first capping pattern 145 may be disposed on the first gate electrode 120 and the first gate spacers 140. A second capping pattern 245 may be disposed on the second gate electrode 220 and the second gate spacers 240. Upper surfaces of the first gate spacers 140 and upper surfaces of the second gate spacers 240, like an upper surface of the first gate electrode 120 and an upper surface of the second gate electrode 220, may be recessed toward upper surfaces of the first active patterns AF1.

Unlike what is illustrated in the drawings, the upper surfaces of the first gate spacers 140 and the upper surfaces of the second spacers 240 might not be recessed toward the upper surfaces of the first active patterns AF1. In this case, the first capping pattern 145 may be disposed between sidewalls of the first gate spacers 140, and the second capping pattern 245 may be disposed between sidewalls of the second gate spacers 240.

Each of the first capping pattern 145 and the second capping pattern 245 may include at least one of for example, silicon nitride (SiN), silicon oxynitride (SiON), silicon oxide (SiO$_2$), silicon carbonitride (SiCN), silicon oxycarbonitride (SiOCN), and combinations of the same.

Although lower surfaces of the first capping pattern 145 and the second capping pattern 245 are curved in FIGS. 4 and 5, the present invention is not limited to this case.

A source/drain pattern 150 may be formed on the first active patterns AF1. The source/drain pattern 150 may be located on the substrate 100. The source/drain pattern 150 may be disposed between the first gate electrode 120 and the second gate electrode 220. The source/drain pattern 150 may include an epitaxial pattern. The source/drain pattern 150 may be included in a source/drain region of a transistor that uses a first active pattern AF1 as a channel region.

The source/drain pattern 150 may extend along the second direction Y1. The source/drain pattern 150 may be connected to channel pattern portions of the first active patterns AF1 which are used as channels.

Although the source/drain pattern 150 is illustrated as a pattern into which three epitaxial patterns respectively formed on the first active patterns AF1 are merged, this is merely an example used for ease of description, and the present invention is not limited to this example. For example, the epitaxial patterns respectively formed on the first active patterns AF1 may also be separated from each other. Alternatively, two adjacent epitaxial layers may be merged, and the other one might not be merged.

The first source/drain contact 170 and the first gate contact 180 may be disposed on the first active area RX1. The second source/drain contact 270 and the second gate contact 280 may be disposed on the second active area RX2. Unlike what is shown in the drawings, the second gate contact 280 may also be disposed on the first active area RX1.

In the semiconductor device, according to exemplary embodiments of the present disclosure, at least a portion of the first gate contact 180 and at least a portion of the second gate contact 280 may be disposed on the first active area RX1 and the second active area RX2, respectively. For example, at least a portion of the first gate contact 180 and at least a portion of the second gate contact 280 may be disposed at positions overlapping the first active area RX1 and the second active area RX2, respectively.

For example, an entirety of the first gate contact 180 may be disposed on the first active area RX1. The whole of the first gate contact 180 may be disposed at a position overlapping the first active area RX1. The whole of the second gate contact 280 may be disposed on the second active area RX2. The whole of the second gate contact 280 may be disposed at a position overlapping the second active area RX2.

The first source/drain contact 170 may be connected to the source/drain pattern 150 formed in the first active area RX1. The second source/drain contact 270 may be connected to a source/drain pattern formed in the second active area RX2. The first gate contact 180 may be connected to the first gate electrode 120, and the second gate contact 280 may be connected to the second gate electrode 220.

The following description will be given using the first source/drain contact 170 and the first gate contact 180 disposed in the first active area RX1.

The first source/drain contact 170 may be connected to the source/drain pattern 150. The first source/drain contact 170 may be disposed on the source/drain pattern 150.

A silicide layer 155 may be formed between the first source/drain contact 170 and the source/drain pattern 150. Although the silicide layer 155 is illustrated as being formed along the profile of a boundary surface between the source/drain pattern 150 and the first source/drain contact 170, the present invention is not limited to this case. The silicide layer 155 may include, for example, a metal silicide material.

The first source/drain contact 170 may include a lower contact structure 171 extending in the second direction Y1 and an upper contact structure 172 disposed on the lower contact structure 171. The upper contact structure 172 may protrude from the lower contact structure 171. The upper contact structure 172 protrudes above an upper surface 171us of the lower contact structure 171. The upper contact structure 172 is directly connected to the lower contact structure 171.

A width of the lower contact structure 171 in the second direction Y1 is greater than a width of the upper contact structure 172. For example, a width of the upper surface 171us of the lower contact structure 171 is greater than a width of a lower surface of the upper contact structure 172. For example, in a cross-sectional view taken in the second direction Y1, the first source/drain contact 170 may have a "T" shape rotated 180 degrees.

The lower contact structure 171 may include a first sidewall 171sa and a second sidewall 171sb facing away from each other in the second direction Y1. The upper contact structure 172 may include a first sidewall 172sa and a second sidewall 172sb facing away from each other in the second direction Y1. The first sidewall 172sa of the upper contact structure 172 and the second sidewall 172sb of the upper contact structure 172 may be directly connected to the upper surface 171us of the lower contact structure 171. The first sidewall 171sa of the lower contact structure 171 is closer to the first sidewall 172sa of the upper contact structure 172 than to the second sidewall 172sb of the upper contact structure 172.

The first source/drain contact 170 may include a first contact barrier layer 170a and a first contact filling layer 170b disposed on the first contact barrier layer 170a. The first contact barrier layer 170a may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh). The first contact filling layer 170b may include at least one of, for example, aluminum (Al), tungsten (W), cobalt (Co), ruthenium (Ru), and molybdenum (Mo). For example, the first contact filling layer 170b may include cobalt (Co).

In the semiconductor device, according to exemplary embodiments of the present disclosure, the first contact barrier layer 170a might not be exposed at the first sidewall 172sa of the upper contact structure 172 and the second sidewall 172sb of the upper contact structure 172.

In the semiconductor device, according to an exemplary embodiments of the present disclosure, a first distance W1 from a center line 172CL of the upper contact structure 172 to the first sidewall 171sa of the lower contact structure 171 may be equal to a second distance W2 from the center line 172CL of the upper contact structure 172 to the second sidewall 171sb of the lower contact structure 171.

Here, the center line 172CL of the upper contact structure 172 may be an imaginary line that halves the upper surface 172us of the upper contact structure 172 and is orthogonal to an upper surface 172us of the upper contact structure 172. In addition, points on the first sidewall 171sa of the lower contact structure 171 and the second sidewall 171sb of the lower contact structure 171 from which the first distance W1 and the second distance W2 are measured may be points at which the first sidewall 171sa of the lower contact structure 171 and the second sidewall 171sb of the lower contact structure 171 meet an imaginary line that is parallel to the upper surface 172us of the upper contact structure 172 when the imaginary line is moved toward the substrate 100.

In the semiconductor device, according to exemplary embodiments of the present disclosure, the first sidewall 172sa of the upper contact structure 172 and the second sidewall 172sb of the upper contact structure 172 may have a bumpy structure. The first sidewall 171sa of the lower contact structure 171 and the second sidewall 171sb of the lower contact structure 171 might not have a bumpy structure.

For example, the first sidewall 172sa of the upper contact structure 172 may include a plurality of first sub-sidewalls 172saa, 172sab, 172sac and 172sad. The second sidewall 172sb of the upper contact structure 172 may include a plurality of second sub-sidewalls 172sba, 172sbb, 172sbc and 172sbd. In the semiconductor device, according to exemplary embodiments of the present disclosure, the number of the first sub-sidewalls 172saa, 172sab, 172sac and 172sad included in the first sidewall 172sa of the upper contact structure 172 is equal to the number of the second sub-sidewalls 172sba, 172sbb, 172sbc and 172sbd included in the second sidewall 172sb of the upper contact structure 172.

Although each of the first sidewall 172sa of the upper contact structure 172 and the second sidewall 172sb of the upper contact structure 172 includes four sub-sidewalls, the present invention is not limited to this case. The first sidewall 172sa of the upper contact structure 172 and the second sidewall 172sb of the upper contact structure 172 may include the same number of (e.g. two or more) sub-sidewalls.

Each of the first sub-sidewalls 172saa, 172sab, 172sac and 172sad may include a surface concave toward the inside of the upper contact structure 172. Each of the second sub-sidewalls 172sba, 172sbb, 172sbc and 172sbd may include a surface concave toward the inside of the upper contact structure 172.

Adjacent first sub-sidewalls 172saa, 172sab, 172sac and 172sad may be directly connected to each other. Adjacent second sub-sidewalls 172sba, 172sbb, 172sbc and 172sbd may be directly connected to each other.

In the semiconductor device, according to exemplary embodiments of the present disclosure, respective heights h11, h21, h31 and h41 of the first sub-sidewalls 172*saa*, 172*sab*, 172*sac* and 172*sad* may be substantially equal. Respective heights h12, h22, h32 and h42 of the second sub-sidewalls 172*sba*, 172*sbb*, 172*sbc* and 172*sbd* may be substantially equal. Here, "equal height" is intended to encompass not only exactly identical height at two positions being compared but also may include two slightly different heights having a minute difference caused by a process margin or the like.

In addition, for example, the height h11 of the $(1\_1)^{th}$ sub-sidewall 172*saa* may be equal to the height h2 of the $(2\_1)^{th}$ sub-sidewall 172*sba* located at a position corresponding to the $(1\_1)^{th}$ sub-sidewall 172*saa*. Therefore, in the semiconductor device, according to exemplary embodiments of the present disclosure, a height of the first sidewall 172*sa* of the upper contact structure 172 may be substantially equal to a height of the second sidewall 172*sb* of the upper contact structure 172.

The upper contact structure 172 may include one or more apex parts 172*tp*. Each of the apex parts 172*tp* may be defined where adjacent curved surfaces, for example, adjacent concave surfaces meet. For example, each of the apex parts 172*tp* may be defined where adjacent first sub-sidewalls 172*saa* and 172*sab* meet. For example, a portion of a first sub-sidewall included in the first sidewall 172*sa* of the upper contact structure 172 and a portion of the first sub-sidewall included in the first sidewall 172*sa* of the upper contact structure 172 may be defined between the apex parts 172*tp* adjacent to each other in a thickness direction of the substrate 100. In the semiconductor device, according to exemplary embodiments of the present disclosure, a point where the upper surface 172*us* of the upper contact structure 172 meets the first sidewall 172*sa* of the upper contact structure 172 and a point where the upper surface 172*us* of the upper contact structure 172 meets the second sidewall 172*sb* of the upper contact structure 172 are not apex parts.

Each of the first sidewall 172*sa* of the upper contact structure 172 and the second sidewall 172*sb* of the upper contact structure 172 includes a plurality of sub-sidewalls. In the semiconductor device, according to exemplary embodiments of the present disclosure, the upper contact structure 172 may include one or more apex parts 172*tp* formed on the first sidewall 172*sa* of the upper contact structure 172 and one or more apex parts 172*tp* formed on the second sidewall 172*sb* of the upper contact structure 172.

In the semiconductor device, according to exemplary embodiments of the present disclosure, the upper contact structure 172 may include an even number of apex parts 172*tp*.

The height h11 of the first sub-sidewall 172*saa* may be equal to the height h12 of the second sub-sidewall 172*sba* located at a position corresponding to the first sub-sidewall 172*saa*. Therefore, a depth (h11+h21+h31) from the upper surface 172*us* of the upper contact structure 172 to a lowermost apex part 172*tp* among the apex parts 172*tp* formed on the first sidewall 172*sa* of the upper contact structure 172 may be equal to a depth (h12+h22+h32) from the upper surface 172*us* of the upper contact structure 172 to a lowermost apex part 172*tp* among the apex parts 172*tp* formed on the second sidewall 172*sb* of the upper contact structure 172.

A height h52 from the upper surfaces of the first active patterns AF1 to the upper surface of the first gate electrode 120 may be equal to or greater than a height h51 from the upper surfaces of the first active pattern AF1 to an upper surface of the lower contact structure 171. Therefore, a short circuit between the first gate contact 180 and the first source/drain contact 170 can be prevented even if the first gate contact 180 is disposed in the first active area RX1.

The contact insulating liner 175 may extend along the first sidewall 172*sa* of the upper contact structure 172 and the second sidewall 172*sb* of the upper contact structure 172. The contact insulating liner 175 may extend along the first sub-sidewalls 172*saa*, 172*sab*, 172*sac* and 172*sad* and the second sub-sidewalls 172*sba*, 172*sbb*, 172*sbc* and 172*sbd*.

In the semiconductor device, according to exemplary embodiments of the present disclosure, the contact insulating liner 175 might not be formed on the upper surface 171*us* of the lower contact structure 171. The contact insulating liner 175 might not extend along the upper surface 171*us* of the lower contact structure 171.

The contact insulating liner 175 may include at least one of, for example, silicon nitride (SiN), silicon oxynitride (SiON), silicon oxycarbide (SiOC), aluminum oxide (AlO), and aluminum nitride (AlN). The contact insulating liner 175 may have a thickness of, but not limited to, 1 nm to 6 nm.

In FIG. 3, portions of the contact insulating liner 175 extending along the first sub-sidewalls 172*saa*, 172*sab*, 172*sac* and 172*sad*, respectively, are connected to each other, and portions of the contact insulating liner 175 extending along the second sub-sidewalls 172*sba*, 172*sbb*, 172*sbc* and 172*sbd*, respectively, are connected to each other. However, the present invention is not limited to this case. For example, the portions of the contact insulating liner 175 extending along the first sub-sidewalls 172*saa*, 172*sab*, 172*sac* and 172*sad* and the second sub-sidewalls 172*sba*, 172*sbb*, 172*sbc* and 172*sbd* may also be separated at the apex parts 172*tp*.

Thicknesses t11, t21, t31 and t41 of the portions of the contact insulating liner 175 disposed on the first sub-sidewalls 172*saa*, 172*sab*, 172*sac* and 172*sad*, respectively, may be equal. Thicknesses t12, t22, t32 and t42 of the portions of the contact insulating liner 175 disposed on the second sub-sidewalls 172*sba*, 172*sbb*, 172*sbc* and 172*sbd*, respectively, may be equal. For example, the thickness t11 of the contact insulating liner 175 on the $(1\_1)^{th}$ sub-sidewall 172*saa* may be equal to the thickness t21 of the contact insulating liner 175 on the $(1\_2)^{th}$ sub-sidewall 172*sab*. Here, the thickness of the contact insulating liner 175 may be a thickness at an innermost portion of a concave surface of the upper contact structure 172.

The first gate contact 180 may be disposed on the first gate electrode 120. The first gate contact 180 may penetrate the first capping pattern 145 and may be connected to the first gate electrode 120. The first gate contact 180 may be partially surrounded by the first capping pattern 145.

The first gate contact 180 may include a first gate contact barrier layer 180*a* and a first gate contact filling layer 180*b* disposed on the first gate contact barrier layer 180*a*. For example, the first gate contact filling layer 180*b* may include cobalt (Co).

A first interlayer insulating film 190 may be formed on the field insulating layer 105. The first interlayer insulating film 190 may at least partially surround the first source/drain contact 170 and the first gate contact 180. The first interlayer insulating film 190 does not cover the upper surface 172*us* of the first source/drain contact 170 and an upper surface of the first gate contact 180. The first interlayer insulating film 190 may expose the upper surface 172*us* of the first source/drain contact 170 and the upper surface of the first gate contact 180. The first interlayer insulating film 190 may include at least one of for example, silicon oxide, silicon nitride, silicon oxynitride, and a low-k material. The low-k material may include, but is not limited to, at least one of, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyidisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, and combinations of the same.

A first etch stop layer 191 may be disposed on the first interlayer insulating film 190. The first etch stop layer 191 may include at least one of, for example, silicon nitride (SiN), silicon oxynitride (SiON), silicon carbonitride (SiCN), and silicon oxycarbide (SiOC).

A second interlayer insulating film 192 may be disposed on the first etch stop layer 191. The second interlayer insulating film 192 may include at least one of, for example, silicon oxide, silicon nitride, silicon oxynitride, and a low-k material.

The wiring structure 210 may be disposed in the first etch stop layer 191 and the second interlayer insulating film 192. The wiring structure 210 may be electrically connected to, for example, the first source/drain contact 170, the first gate contact 180, the second source/drain contact 270, and the second gate contact 280.

The wiring structure 210 may include a via 211 and a wiring pattern 212. The wiring structure 210 may include a wiring barrier layer 210a and a wiring filling layer 210b. Each of the via 211 and the wiring pattern 212 may include the wiring barrier layer 210a and the wiring fill layer 210b. The wiring barrier layer 210a may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh). The wiring filling layer 210b may include at least one of, for example, aluminum (Al), copper (Cu), tungsten (W), cobalt (Co), ruthenium (Ru), and molybdenum (Mo).

Although the wiring pattern 212 extends in the first direction X1 in FIGS. 2 through 6, this is merely an example used for ease of description, and the present invention not limited to this example.

FIGS. 7 through 10 respectively illustrate semiconductor devices according to exemplary embodiments of the present disclosure. For ease of description, differences from the semiconductor device described above with reference to FIGS. 1 through 6 will be mainly described. It will be understood that to the extent that certain details are not described with respect to what is shown in FIGS. 7 through 10, these omitted details may be at least similar to the details for corresponding elements that have been described above with respect to FIGS. 1 through 6.

Figure 7:
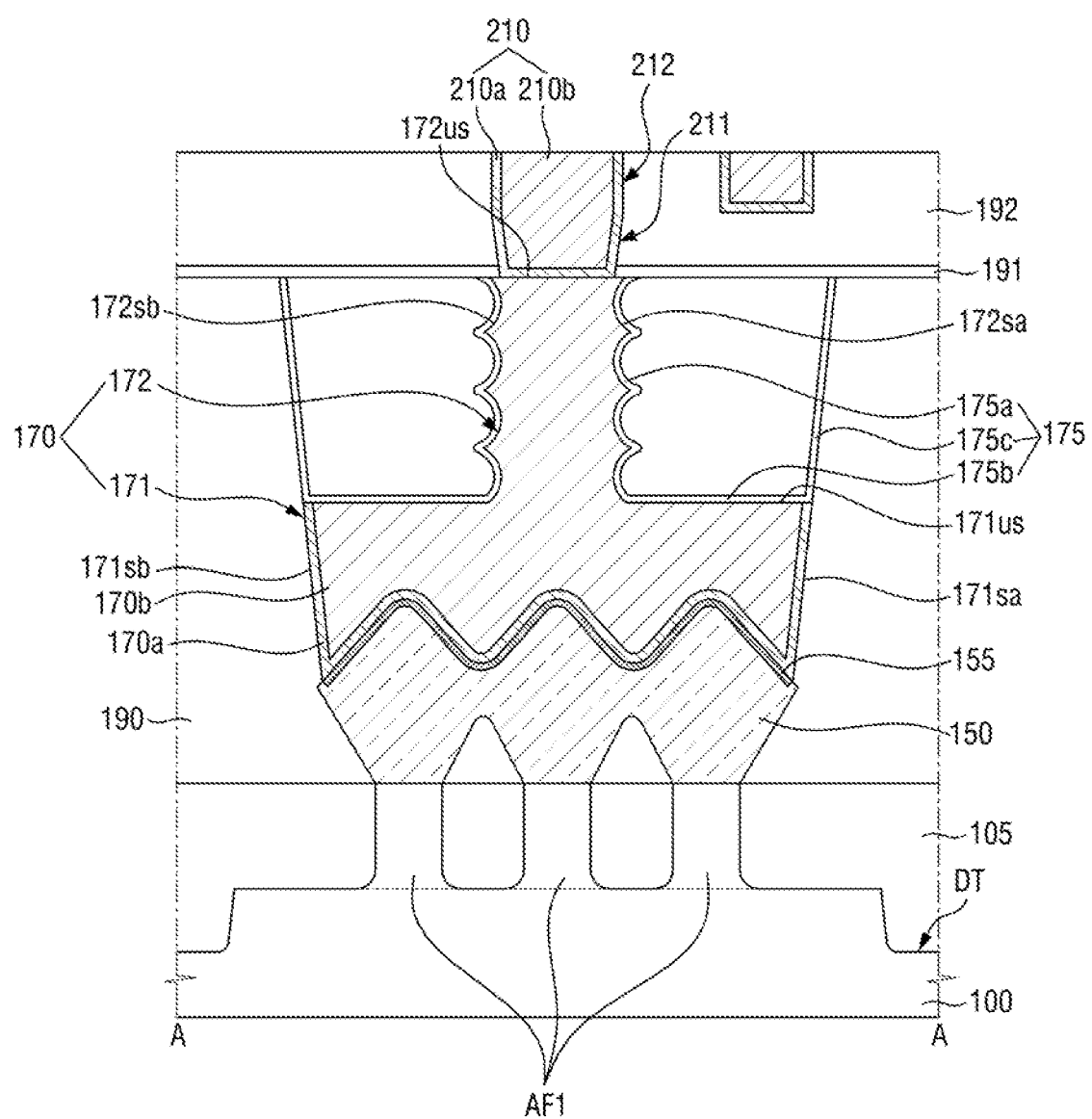
FIGS. 7 through 10 respectively illustrate semiconductor devices according to exemplary embodiments of the present disclosure.

Referring to FIG. 7, in a semiconductor device, according to exemplary embodiments of the present disclosure, a contact insulating liner 175 may include a first portion 175a, a second portion 175b, and a third portion 175c.

The first portion 175a of the contact insulating liner 175 may extend along a first sidewall 172sa of an upper contact structure 172 and a second sidewall 172sb of the upper contact structure 172. The second portion 175b of the contact insulating liner 175 may extend along an upper surface 171us of a lower contact structure 171. An end of the second portion 175b of the contact insulating liner 175 may be connected to the first portion 175a of the contact insulating liner 175. The third portion 175c of the contact insulating liner 175 may be connected to the other end of the second portion 175b of the contact insulating liner 175. The third portion 175c of the contact insulating liner 175 may extend in a direction away from the lower contact structure 171 from the other end of the second portion 175b of the contact insulating liner 175. The third portion 175c of the contact insulating liner 175 may extend to an upper surface of a first interlayer insulating film 190.

A portion of the first interlayer insulating film 190 may fill recesses defined by the contact insulating liner 175. The first interlayer insulating film 190 filling the recesses defined by the contact insulating liner 175 may be formed in a different fabrication process from the first interlayer insulating film 190 covering a first sidewall 171sa of the lower contact structure 171 and the second sidewall 171sb of the lower contact structure 171.

Figure 8:
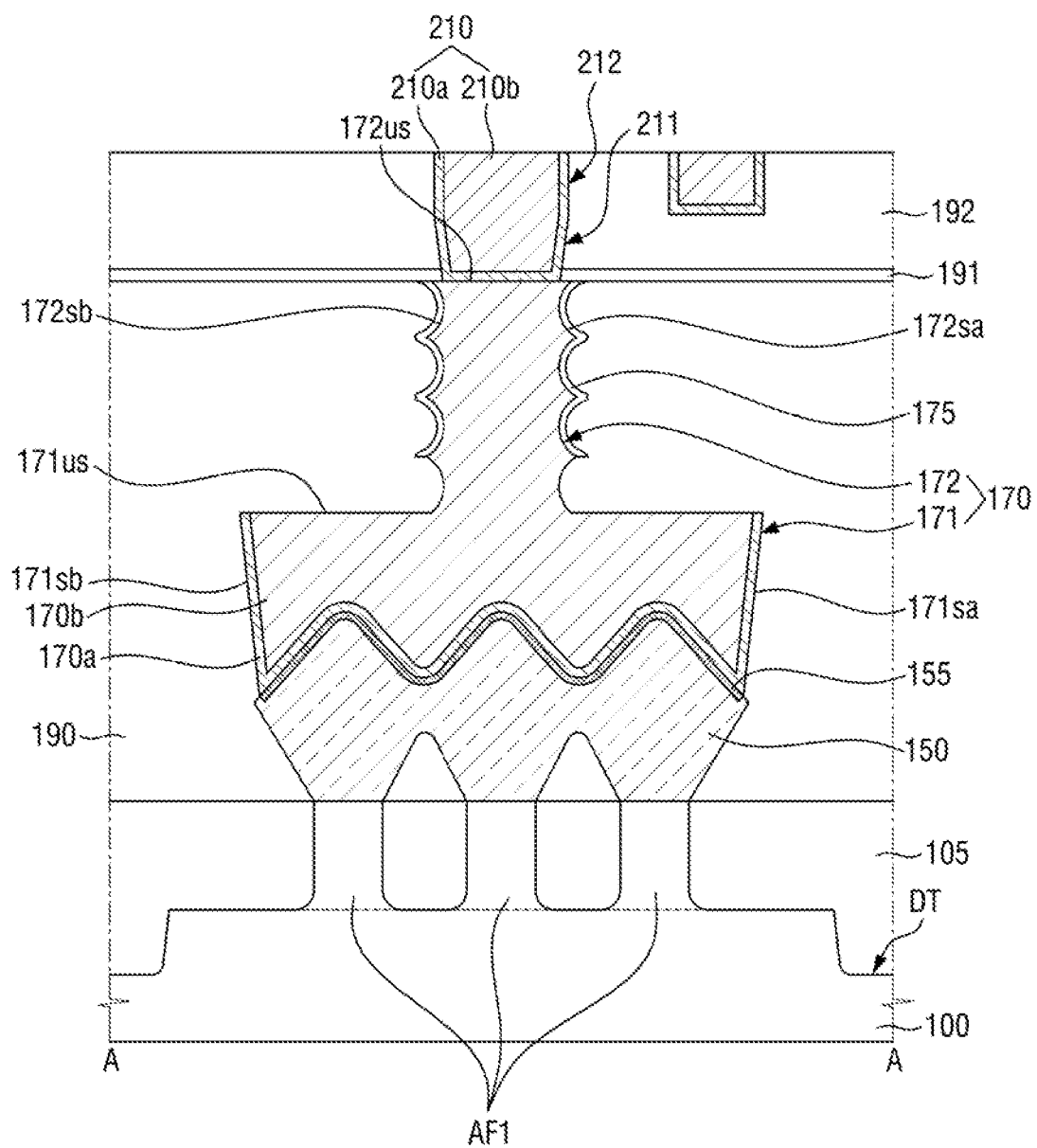

Referring to FIGS. 3 and 8, in a semiconductor device, according to exemplary embodiments of the present disclosure, a contact insulating liner 175 may extend along a portion of a first sidewall 172sa of an upper contact structure 172 and a portion of a second sidewall 172sb of the upper contact structure 172.

The contact insulating liner 175 may be disposed on a $(1\_1)^{th}$ sub-sidewall 172saa, a $(1\_2)^{th}$ sub-sidewall 172sab, a $(1\_3)^{th}$ sub-sidewall 172sac, a $(2\_1)^{th}$ sub-sidewall 172sba, a $(2\_2)^{th}$ sub-sidewall 172sbb, and a $(2\_3)^{th}$ sub-sidewall 172sbc. However, the contact insulating liner 175 is not disposed on a $(1\_4)^{th}$ sub-sidewall 172sad and a $(2\_4)^{th}$ sub-sidewall 172sbd which are connected to an upper surface 171us of a lower contact structure 171.

Figure 9:
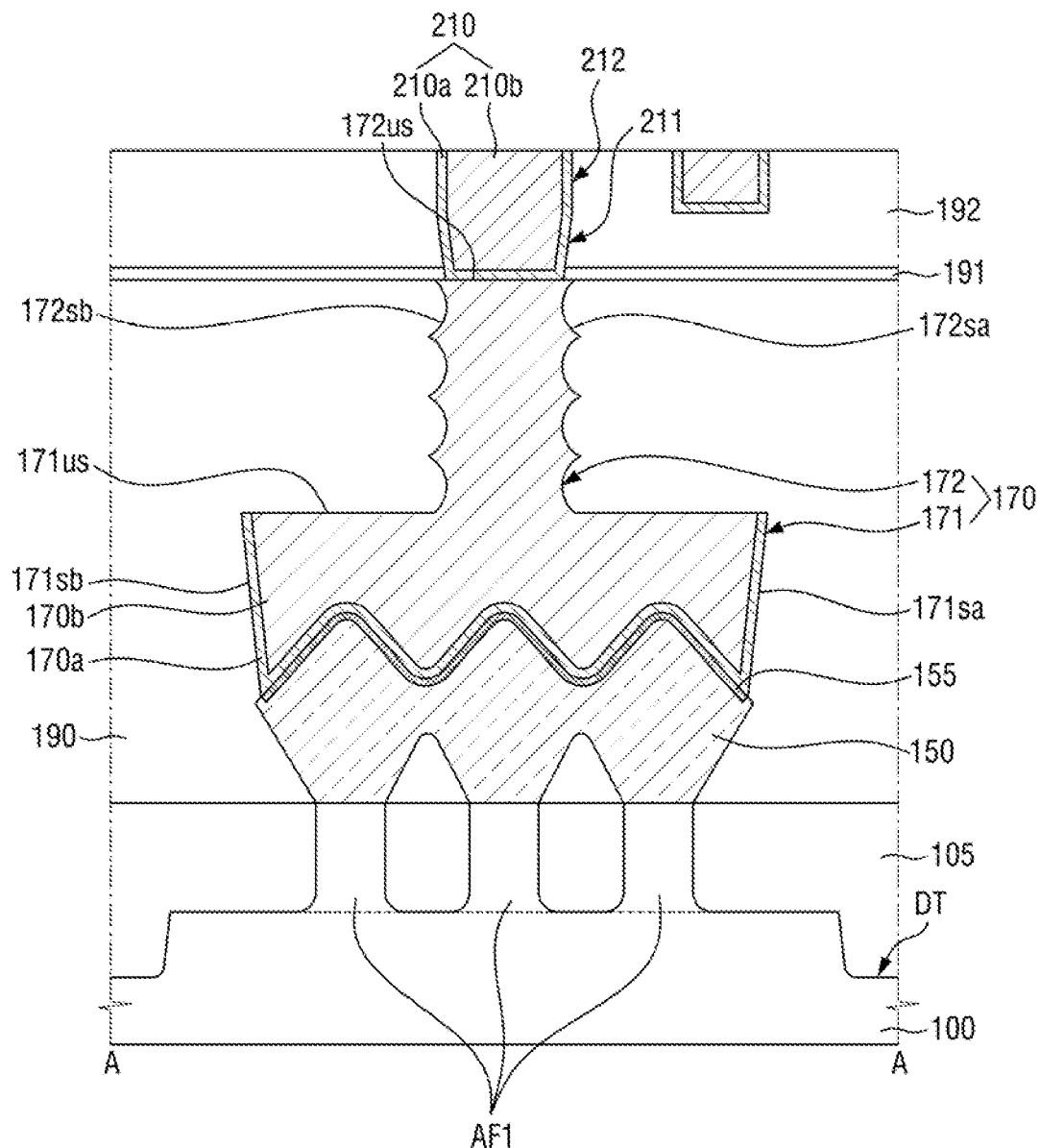

Referring to FIG. 9, in a semiconductor device, according to exemplary embodiments of the present disclosure, a contact insulating liner 172 (see FIG. 2) is not formed on a first sidewall 172sa of an upper contact structure 172 and a second sidewall 172sb of the upper contact structure 172.

The first sidewall 172sa of the upper contact structure 172 and the second sidewall 172sb of the upper contact structure 172 may contact a first interlayer insulating film 190. An oxide of a material contained in a first contact filling layer 170b may be formed along a boundary between the first interlayer insulating film 190 and the upper contact structure 172, but the present invention is not limited to this case.

Figure 10:
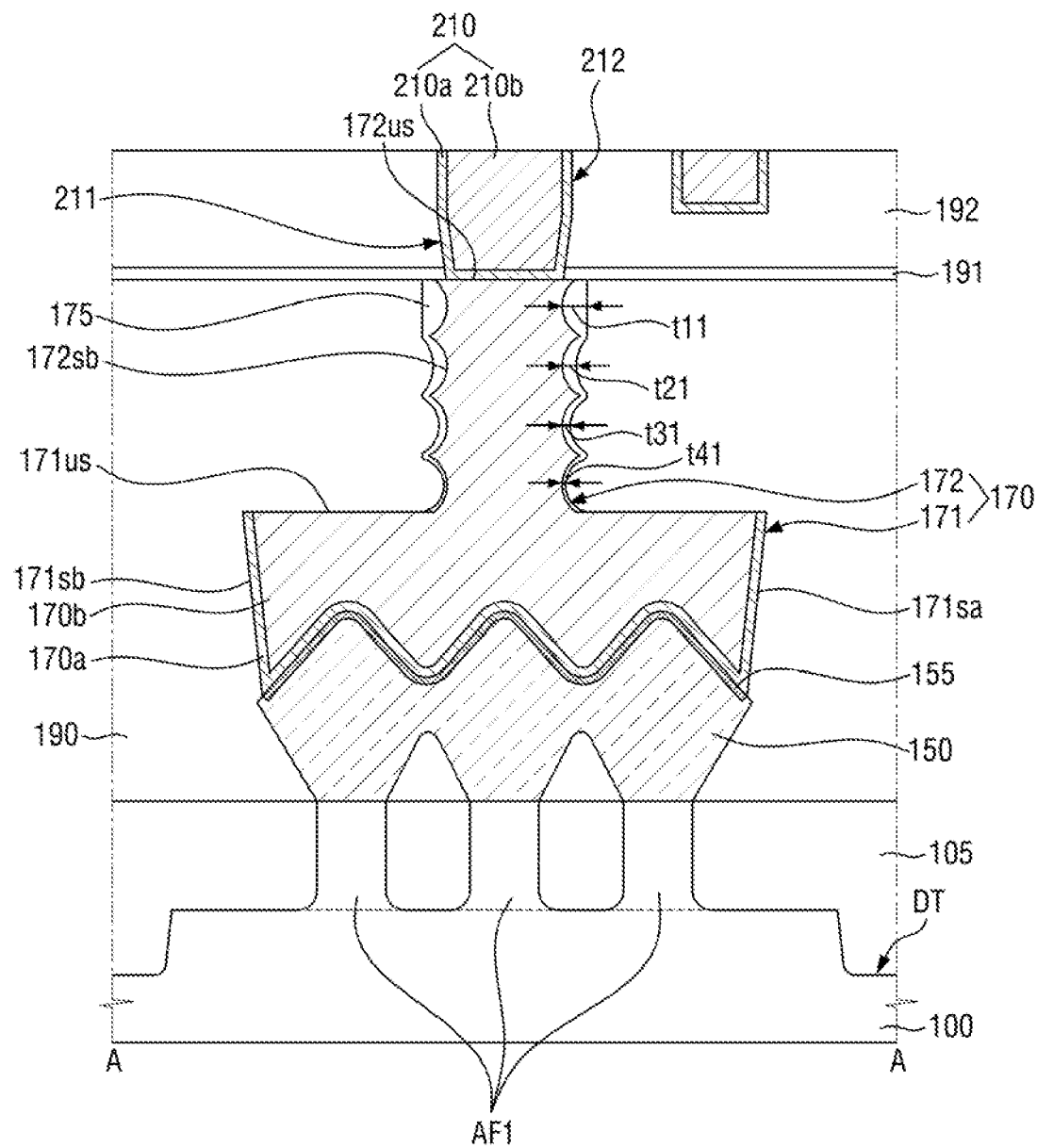

Referring to FIGS. 3 and 10, in a semiconductor device, according to exemplary embodiments of the present disclosure, thicknesses t11, t21, t31 and t41 of portions of a contact insulating liner 175 disposed on first sub-sidewalls 172saa, 172sab, 172sac and 172sad, respectively, may be different from each other.

For example, the thickness t21 of the contact insulating liner 175 disposed on the $(1\_2)^{th}$ sub-sidewall 172sab may be smaller than the thickness t11 of the contact insulating liner 175 disposed on the $(1\_1)^{th}$ sub-sidewall 172saa and greater than the thickness t31 of the contact insulating liner 175 disposed on the $(1\_3)^{th}$ sub-sidewall 172sac. The thickness t31 of the contact insulating liner 175 disposed on the $(1\_3)^{th}$ sub-sidewall 172sac may be greater than the thickness t41 of the contact insulating liner 175 disposed on the $(1\_4)^{th}$ sub-sidewall 172sad.

Unlike in the drawing, for example, the thickness t21 of the contact insulating liner 175 disposed on the $(1\_2)^{th}$ sub-sidewall 172sab may be equal to the thickness t11 of the contact insulating liner 175 disposed on the $(1\_1)^{th}$ sub-sidewall 172saa. For example, the thickness t21 of the contact insulating liner 175 disposed on the $(1\_2)^{th}$ sub-sidewall 172sab and the thickness t31 of the contact insulating liner 175 disposed on the $(1\_3)^{th}$ sub-sidewall 172sac may be equal to the thickness t11 of the contact insulating liner 175 disposed on the $(1\_1)^{th}$ sub-sidewall 172saa.

The thickness of the contact insulating liner 175 disposed on a second sidewall 172sb of an upper contact structure 172 may also be similar to the thickness described above.

Figure 11:
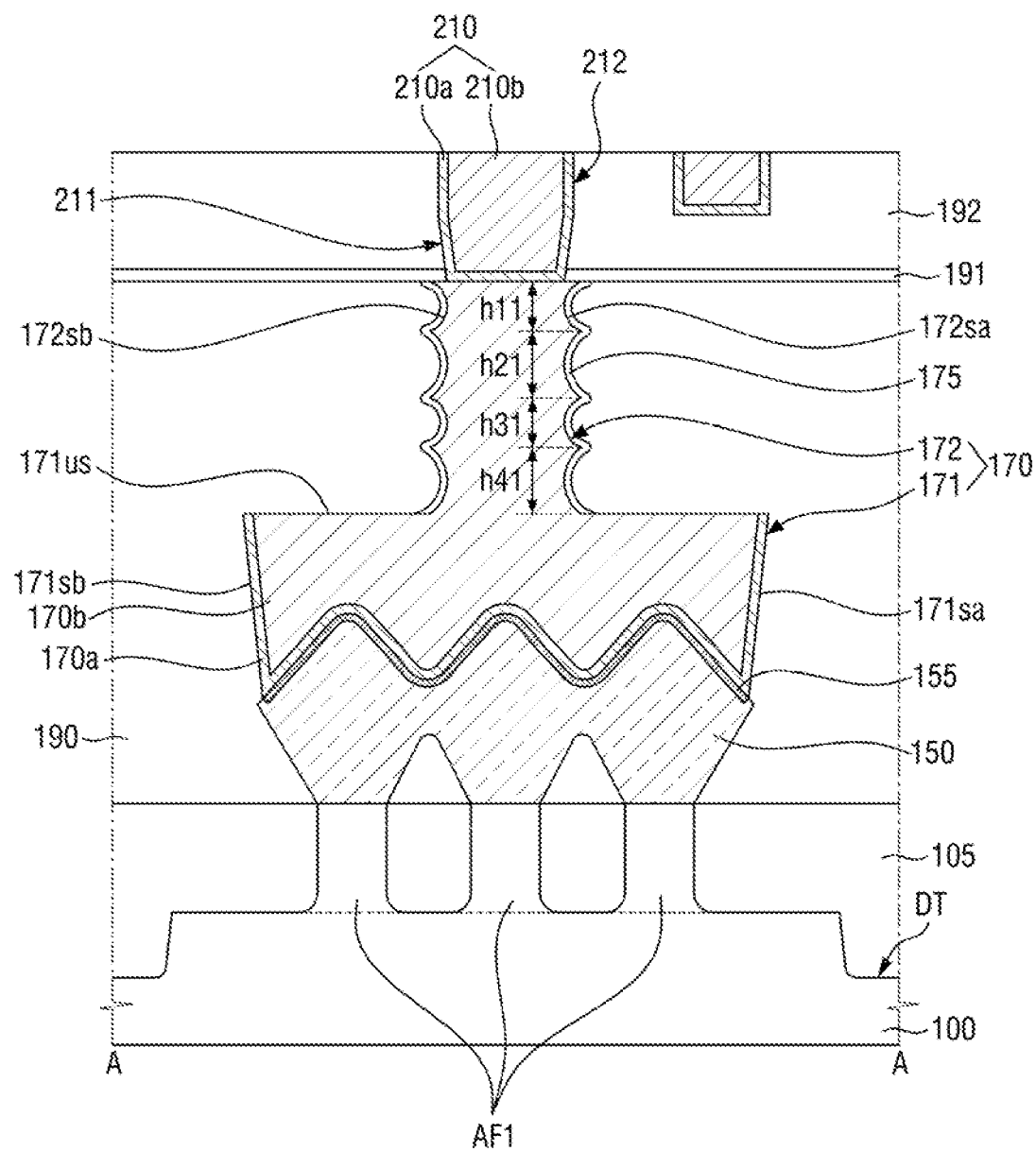
FIGS. 11 through 13 respectively illustrate semiconductor devices according to exemplary embodiments of the present disclosure.
Figure 12:
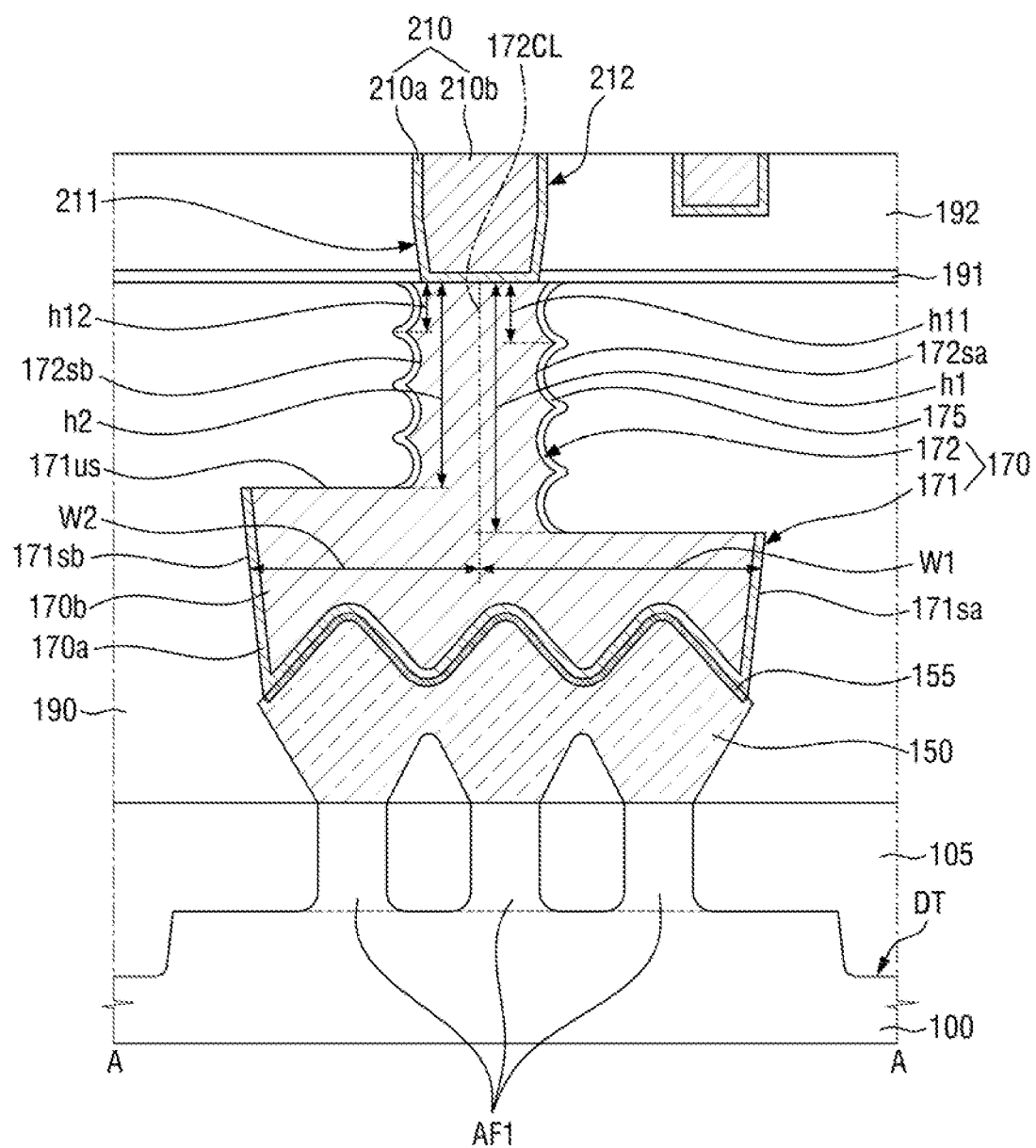
Figure 13:
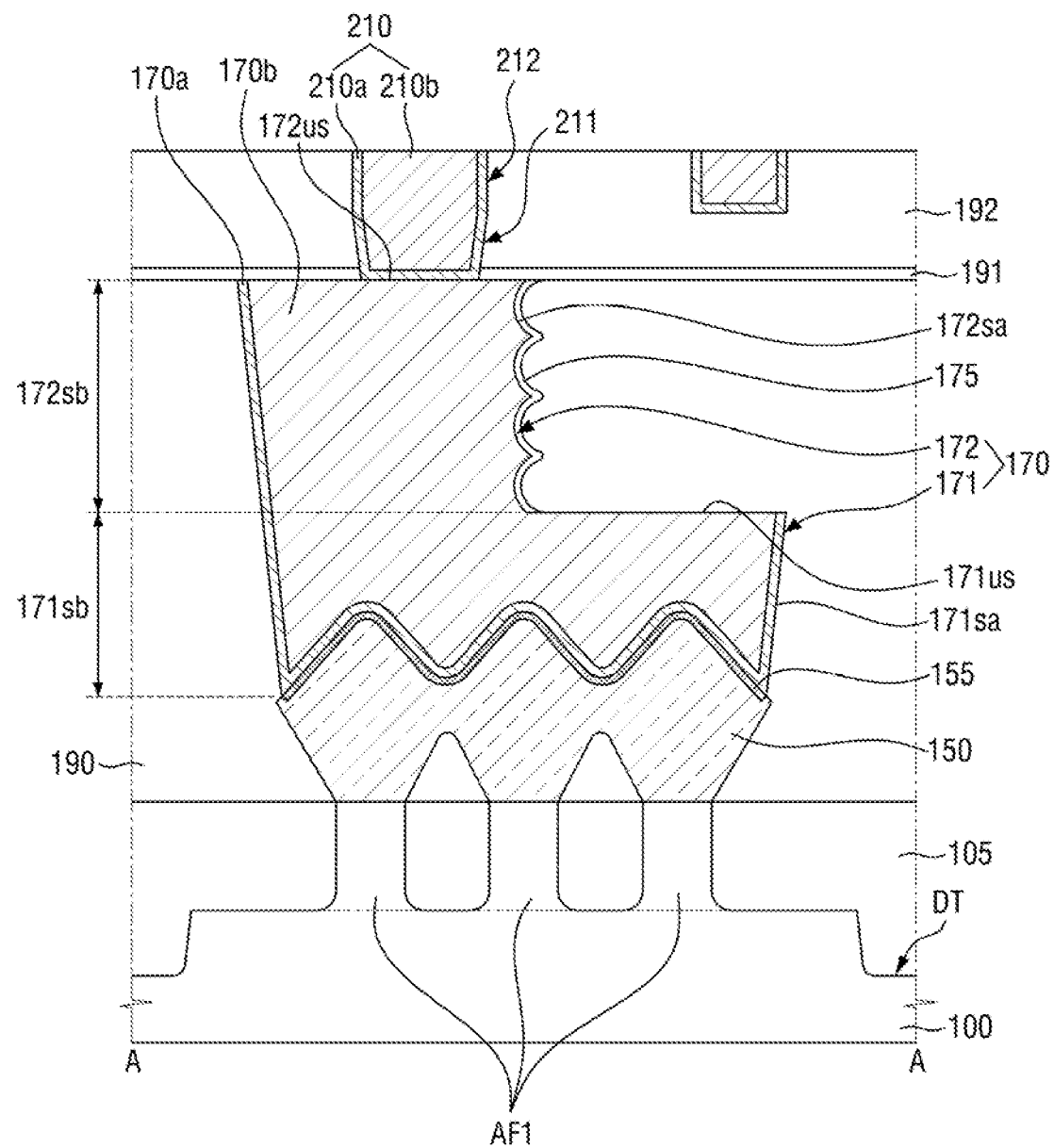

FIGS. 11 through 13 respectively illustrate semiconductor devices according to exemplary embodiments of the present disclosure. For ease of description, differences from the semiconductor device described above with reference to FIGS. 1 through 6 will be mainly described. It will be understood that to the extent that certain details are not described with respect to what is shown in FIGS. 11 through 13, these omitted details may be at least similar to the details for corresponding elements that have been described above with respect to FIGS. 1 through 6.

Referring to FIGS. 3 and 11, in a semiconductor device according to exemplary embodiments of the present disclosure, a height h11 of a $(1\_1)^{th}$ sub-sidewall 172saa, a height h21 of a $(1\_2)^{th}$ sub-sidewall 172sab, a height h31 of a $(1\_3)^{th}$ sub-sidewall 172sac, and a height h41 of a $(1\_4)^{th}$ sub-sidewall 172sad might not be equal.

The height h11 of the $(1\_1)^{th}$ sub-sidewall 172saa is equal to the height h31 of the $(1\_3)^{th}$ sub-sidewall 172sac, the height h21 of the $(1\_2)^{th}$ sub-sidewall 172sab is equal to the height h41 of the $(1\_4)^{th}$ sub-sidewall 172sad, and the height h31 of the $(1\_3)^{th}$ sub-sidewall 172sac is different from the height h41 of the $(1\_4)^{th}$ sub-sidewall 172sad. However, this is merely an example used for ease of description, and the present invention is not limited to this example.

Heights of second sub-sidewalls 172sba, 172sbb, 172sbc and 172sbd may also be similar to the heights described above. The heights of the first sub-sidewalls 172saa, 172sab, 172sac and 172sad may be equal to the heights of the second sub-sidewalls 172sba, 172sbb, 172sbc and 172sbd located at positions corresponding to the first sub-sidewalls 172saa, 172sab, 172sac and 172sad, respectively.

Referring to FIGS. 3 and 12, in a semiconductor device, according to exemplary embodiments of the present disclosure, a first distance W1 from a center line 172CL of an upper contact structure 172 to a first sidewall 171sa of a lower contact structure 171 is greater than a second distance W2 from the center line 172CL of the upper contact structure 172 to a second sidewall 171sb of the lower contact structure 171.

For example, a height h11 of a $(1\_1)^{th}$ sub-sidewall 172saa may be greater than a height h12 of a $(2\_1)^{th}$ sub-sidewall 172sba located at a position corresponding to the $(1\_1)^{th}$ sub-sidewall 172saa. Therefore, a height h1 of a first sidewall 172sa of the upper contact structure 172 may be greater than a height h2 of a second sidewall 172sb of the upper contact structure 172.

When the upper contact structure 172 is concentrated on the side of the second sidewall 171sb of the lower contact structure 171, the number of sub-sidewalls included in the first sidewall 172sa of the upper contact structure 172 may be different from the number of sub-sidewalls included in the second sidewall 172sb of the upper contact structure 172.

Referring to FIGS. 3 and 13, in a semiconductor device, according to exemplary embodiments of the present disclosure, a first sidewall 172sa of an upper contact structure 172 has a bumpy structure, but a second sidewall 172sb of the upper contact structure 172 does not have a bumpy structure.

The first sidewall 172sa of the upper contact structure 172 may include a plurality of first sub-sidewalls 172saa, 172sab, 172sac and 172sad. However, the second sidewall 172sb of the upper contact structure 172 does not include a plurality of sub-sidewalls having concave surfaces.

For example, apex parts 172tp may be formed on the first sidewall 172sa of the upper contact structure 172. The apex parts 172tp are not formed on the second sidewall 172sb of the upper contact structure 172. The upper contact structure 172 may include one or more apex parts 172tp formed on the first sidewall 172sa of the upper contact structure 172. The upper contact structure 172 does not include the apex parts 172tp formed on the second sidewall 172sb of the upper contact structure 172.

A contact insulating liner 175 may extend along the first sidewall 172sa of the upper contact structure 172. The contact insulating liner 175 is not formed on the second sidewall 172sb of the upper contact structure 172.

The first sidewall 172sa of the upper contact structure 172 may be connected to a first sidewall 171sa of a lower contact structure 171 by an upper surface 171us of the lower contact structure 171. The second sidewall 172sb of the upper contact structure 172 may be directly connected to a second sidewall 171sb of the lower contact structure 171.

For example, in a cross-sectional view taken in the second direction Y1, a first source/drain contact 170 may be substantially "L"-shaped.

FIGS. 14 through 18 respectively illustrate semiconductor devices, according to exemplary embodiments of the present disclosure. For ease of description, differences from the semiconductor device described above with reference to FIGS. 1 through 6 will be mainly described. It will be understood that to the extent that certain details are not described with respect to what is shown in FIGS. 14 through 18, these omitted details may be at least similar to the details for corresponding elements that have been described above with respect to FIGS. 21A through 22.

Figure 14:
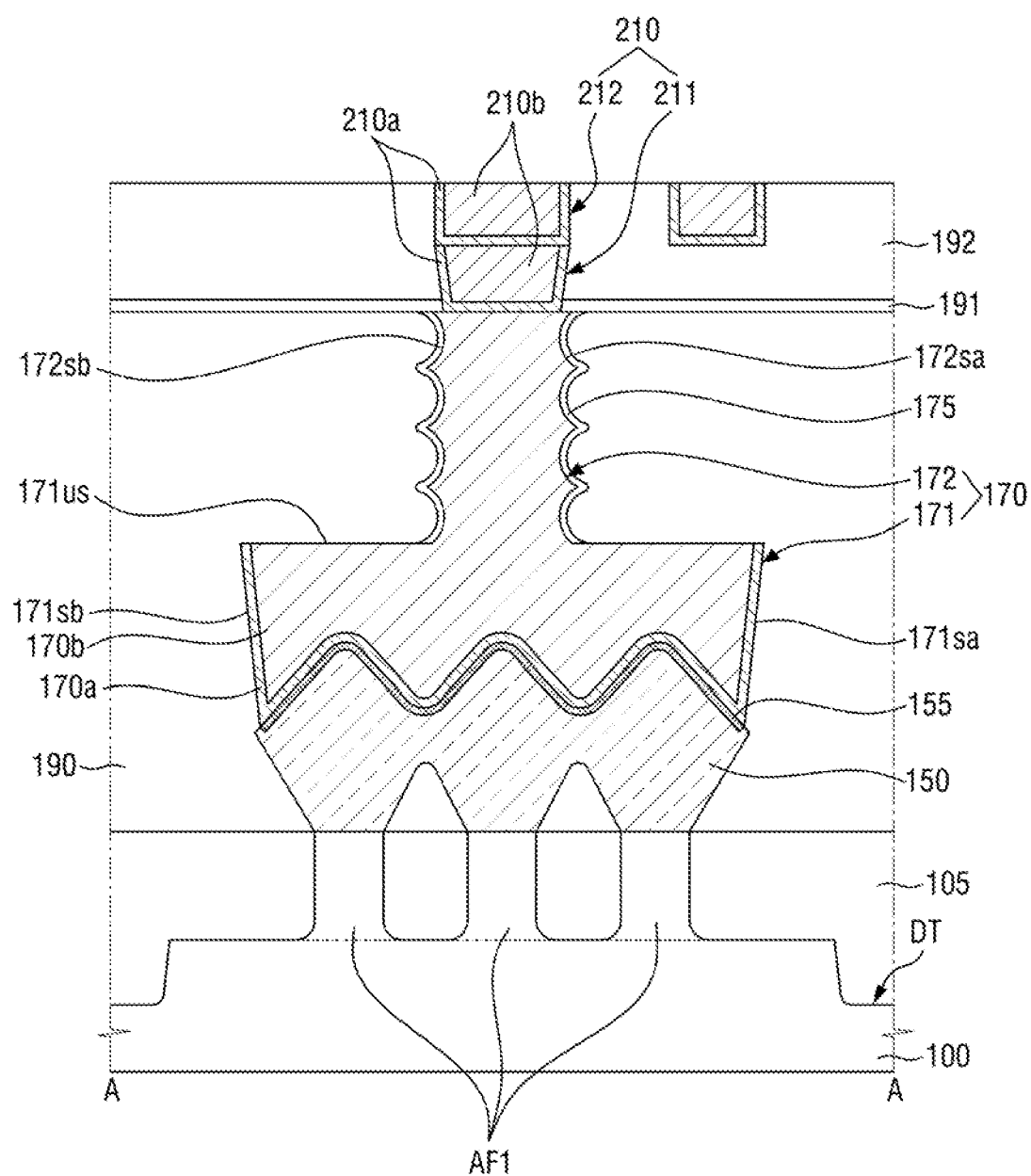
FIGS. 14 through 18 respectively illustrate semiconductor devices according to exemplary embodiments of the present disclosure.

Referring to FIG. 14, in a semiconductor device, according to exemplary embodiments of the present disclosure, a wiring barrier layer 210a may be disposed between a wiring filling layer 210b included in a via 211 and a wiring filling layer 210b included in a wiring pattern 212.

The via 211 may be formed through a different fabrication process from the wiring pattern 212.

Figure 15:
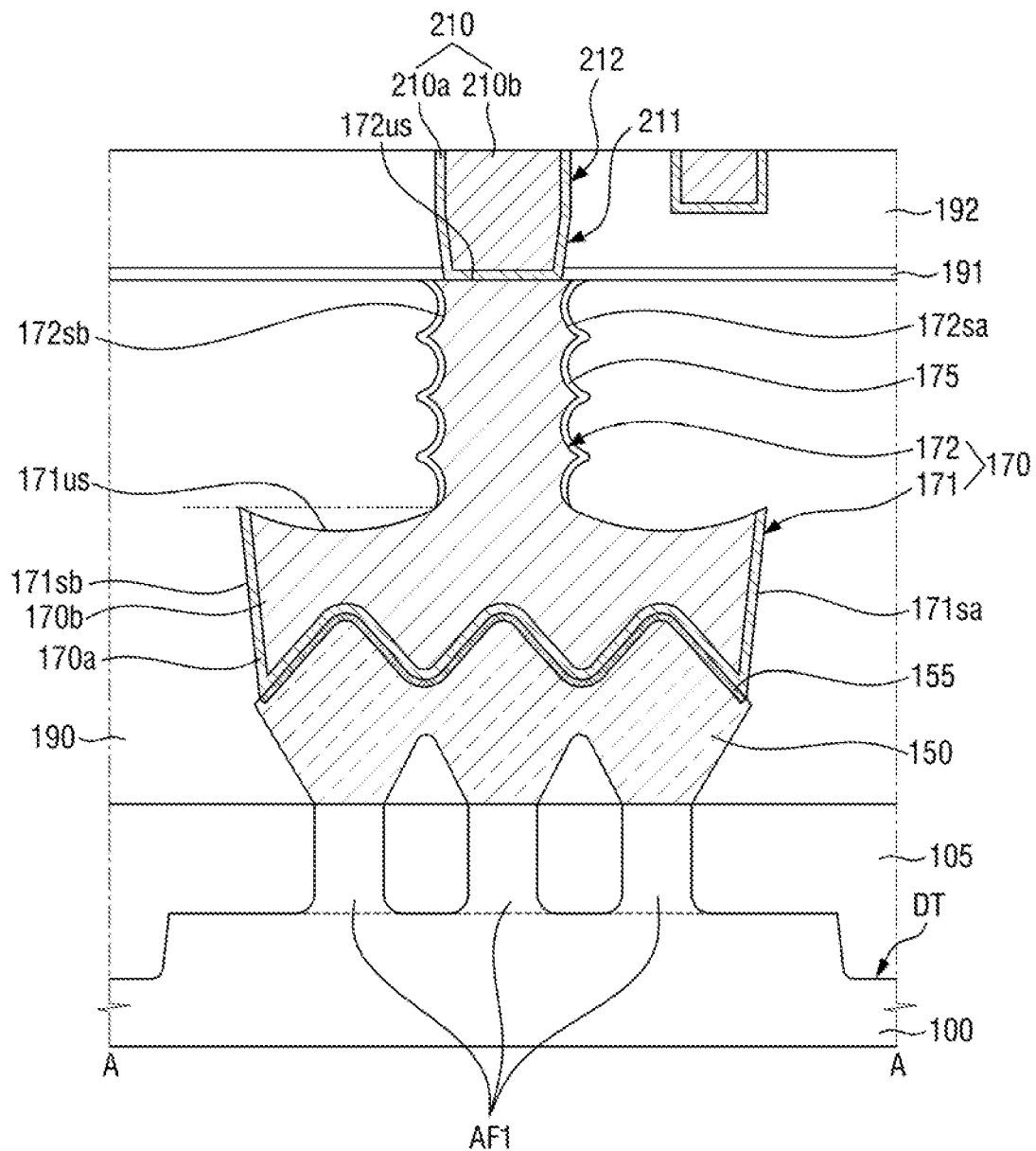
Figure 16:
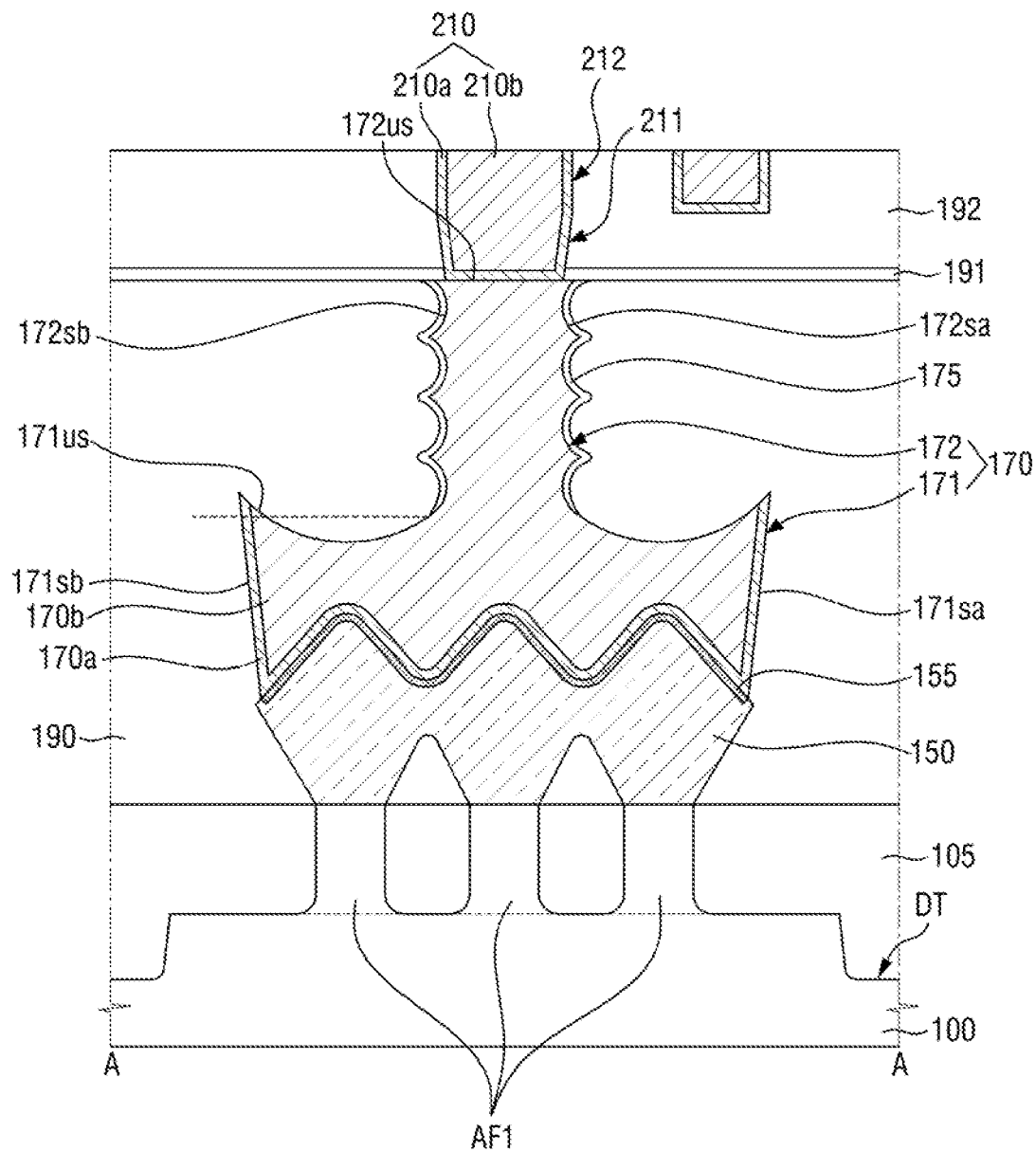

Referring to FIGS. 3, 15, and 16, in semiconductor devices, according to exemplary embodiments of the present disclosure, an upper surface 71us of a lower contact structure 171 may be curved.

In FIG. 15, a highest portion of each of a first sidewall 171sa of the lower contact structure 171 and a second sidewall 171sb of the lower contact structure 171 may be at the same or lower height than a lowest portion of a contact insulating liner 175.

In FIG. 16, a highest portion of each of a first sidewall 171sa of a lower contact structure 171 and a second sidewall 171sb of the lower contact structure 171 may be higher than a lowest portion of a contact insulating liner 175.

Figure 17:
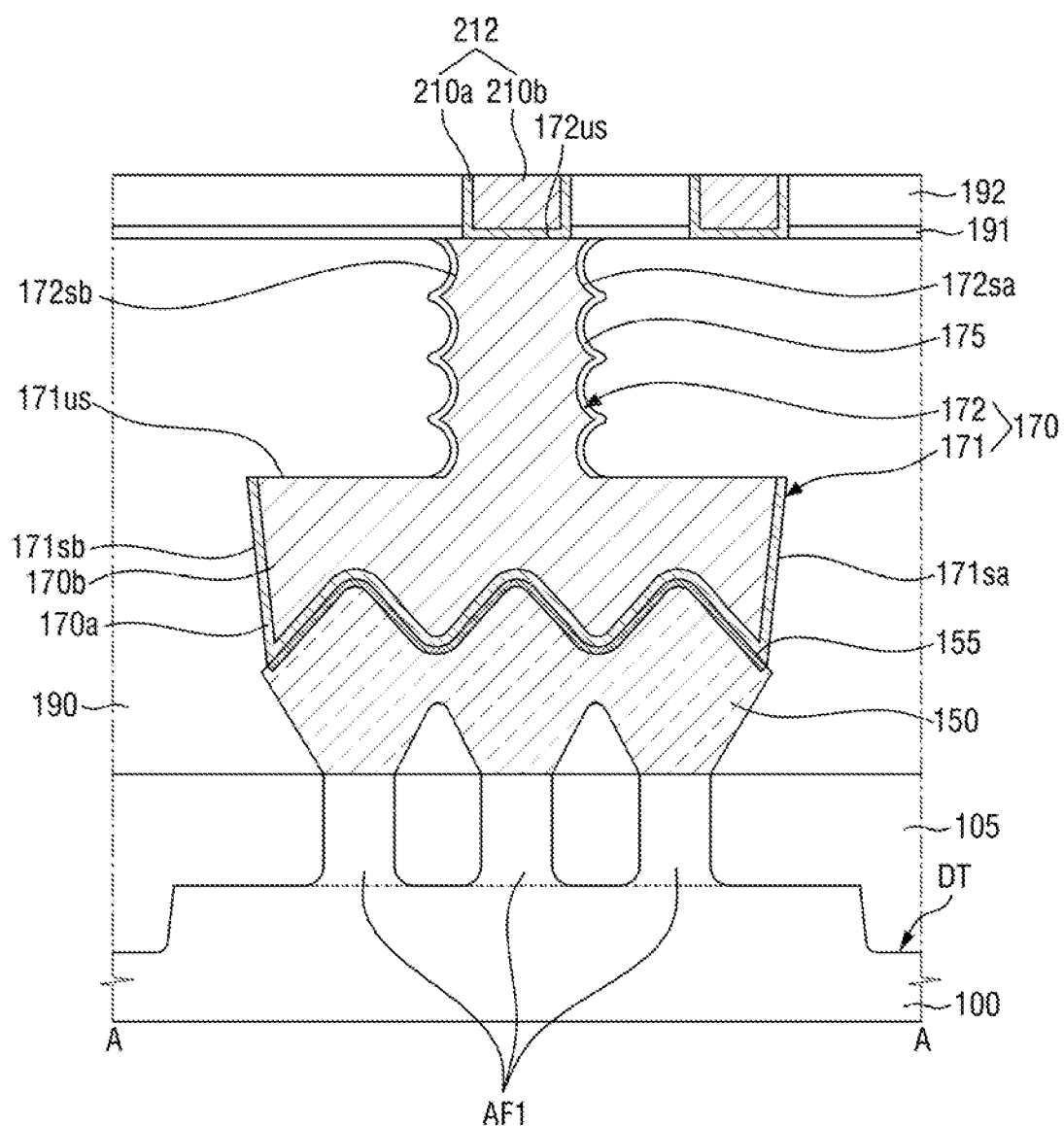

Referring to FIG. 17, in a semiconductor device, according to exemplary embodiments of the present disclosure, a via 211 (see FIG. 2) might not be formed between a wiring pattern 212 and a first source/drain contact 170.

For example, in a wiring stack structure formed in back-end-of-line (BEOL), a wiring formed at a lowest level may be the wiring pattern 212 without a via.

Figure 18:
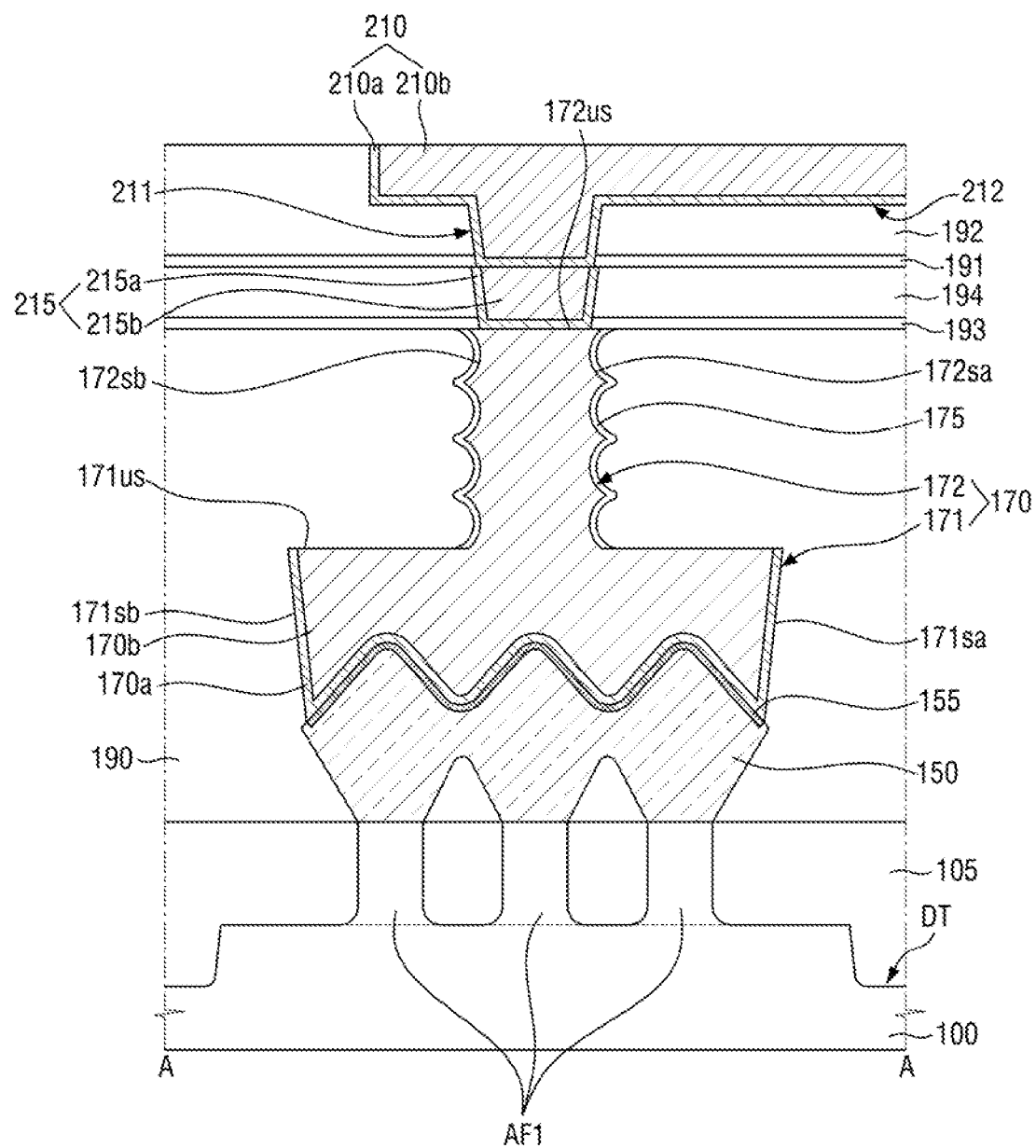

Referring to FIG. 18, in a semiconductor device according to exemplary embodiments of the present disclosure, an insertion contact line 215 may be disposed between a wiring structure 210 and a first source/drain contact 170. The insertion contact line 215 may also be disposed between a first gate contact 180 (see FIG. 6) and the wiring structure 210.

The insertion contact line 215 may include a second contact barrier layer 215a and a second contact filling layer 215b disposed on the second contact barrier layer 215a.

Figure 19:
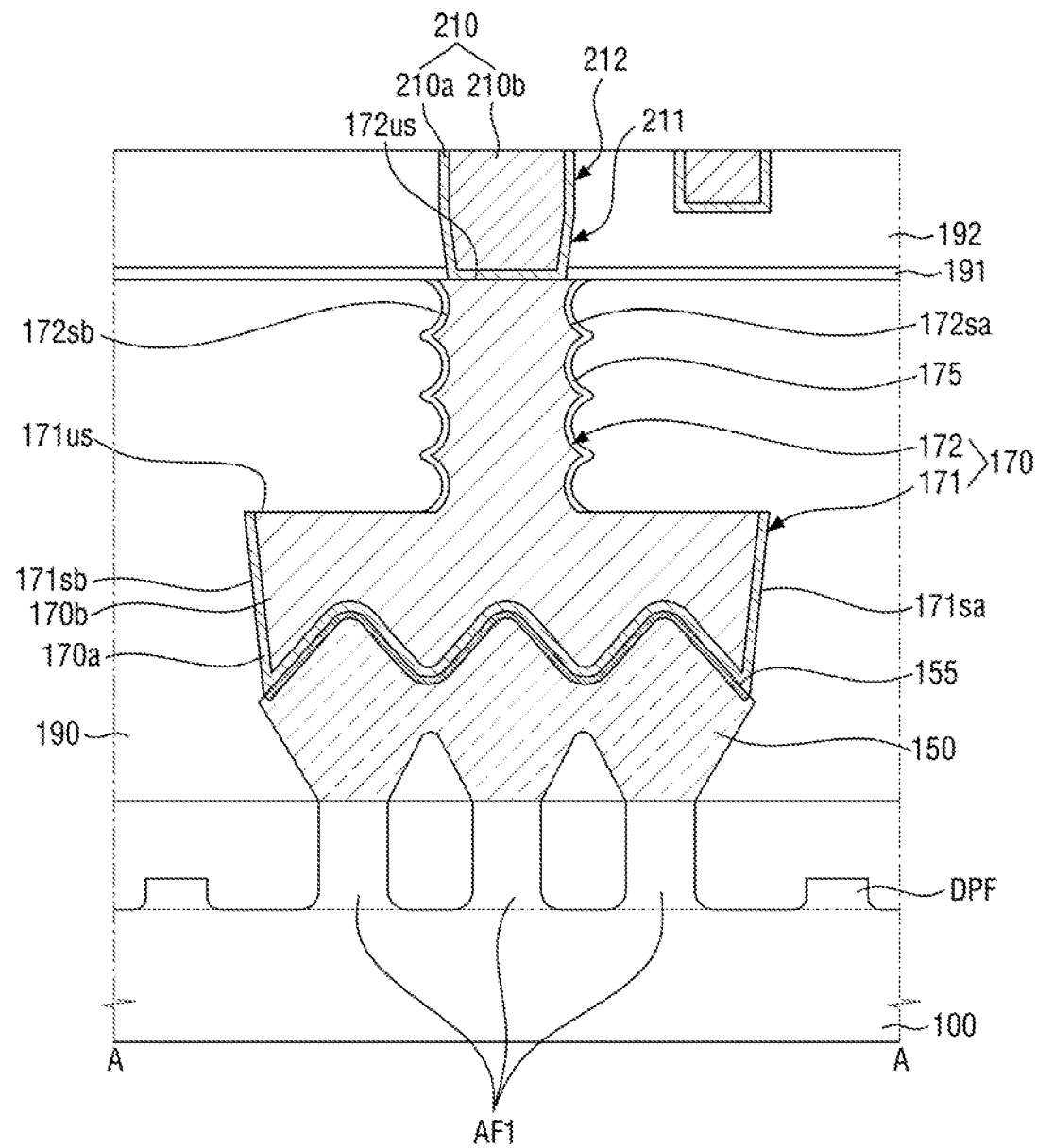
FIGS. 19 and 20 respectively illustrate semiconductor devices according to exemplary embodiments of the present disclosure.
Figure 20:
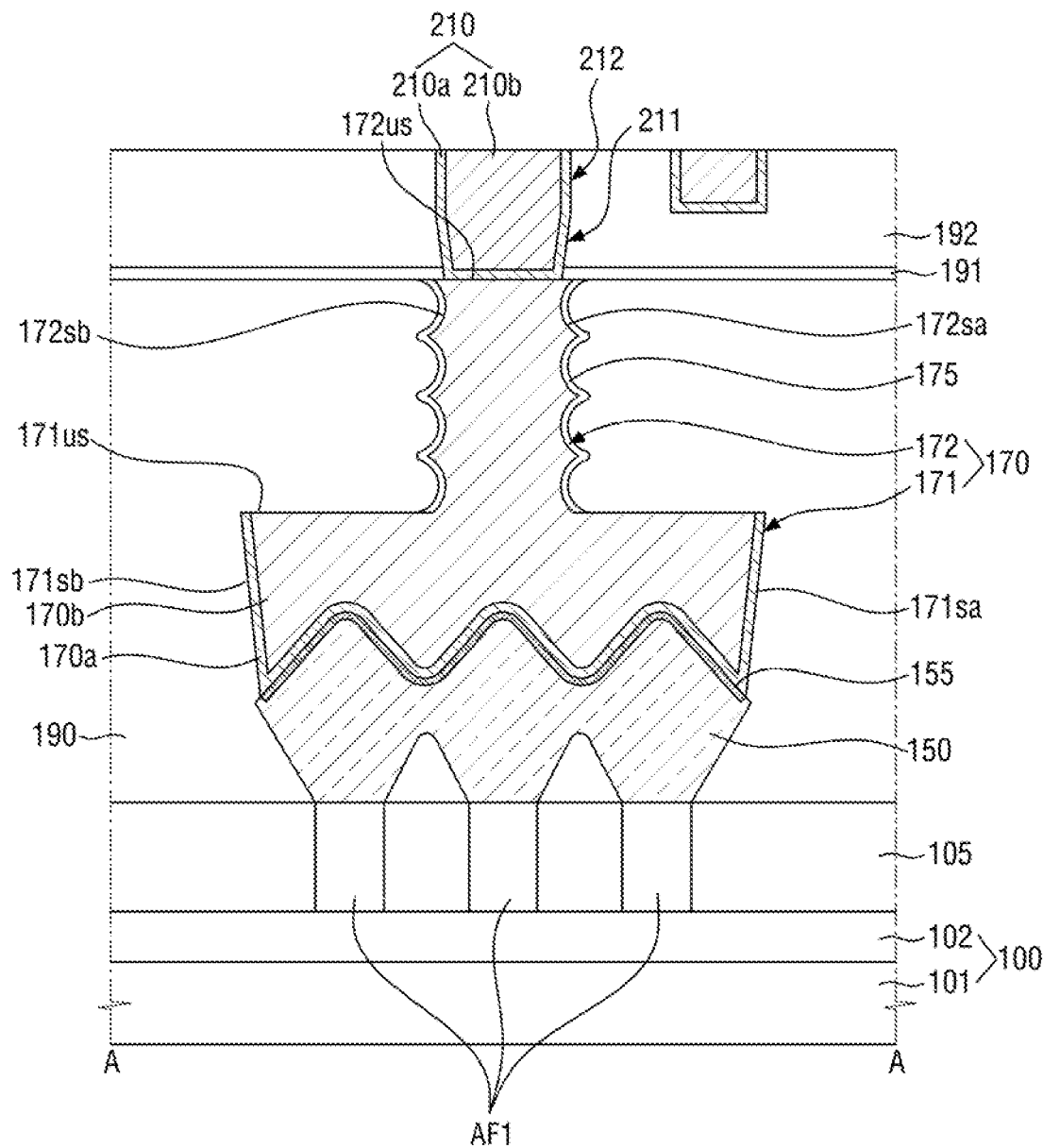

FIGS. 19 and 20 respectively illustrate semiconductor devices according to exemplary embodiments of the present disclosure. For ease of description, differences from the semiconductor device described above with reference to FIGS. 1 through 6 will be mainly described. It will be understood that to the extent that certain details are not described with respect to what is shown in FIGS. 19 through 20, these omitted details may be at least similar to the details for corresponding elements that have been described above with respect to FIGS. 1 through 6.

Referring to FIG. 19, a semiconductor device, according to exemplary embodiments of the present disclosure, may include dummy protruding patterns DPF formed in a field area FX. A deep trench DT (see FIG. 2) is not formed in the field area FX.

Upper surfaces of the dummy protruding patterns DPF are covered by a field insulating layer 105.

Referring to FIG. 20, in a semiconductor device, according to exemplary embodiments of the present disclosure, a substrate 100 may include a base substrate 101 and a buried insulating layer 102 disposed on the base substrate 101.

The base substrate 101 may include, but is not limited to including, a semiconductor material. The buried insulating layer 102 may be formed along an entirety of an upper surface of the base substrate 101. The buried insulating layer 102 may include an insulating material.

Figure 21A:
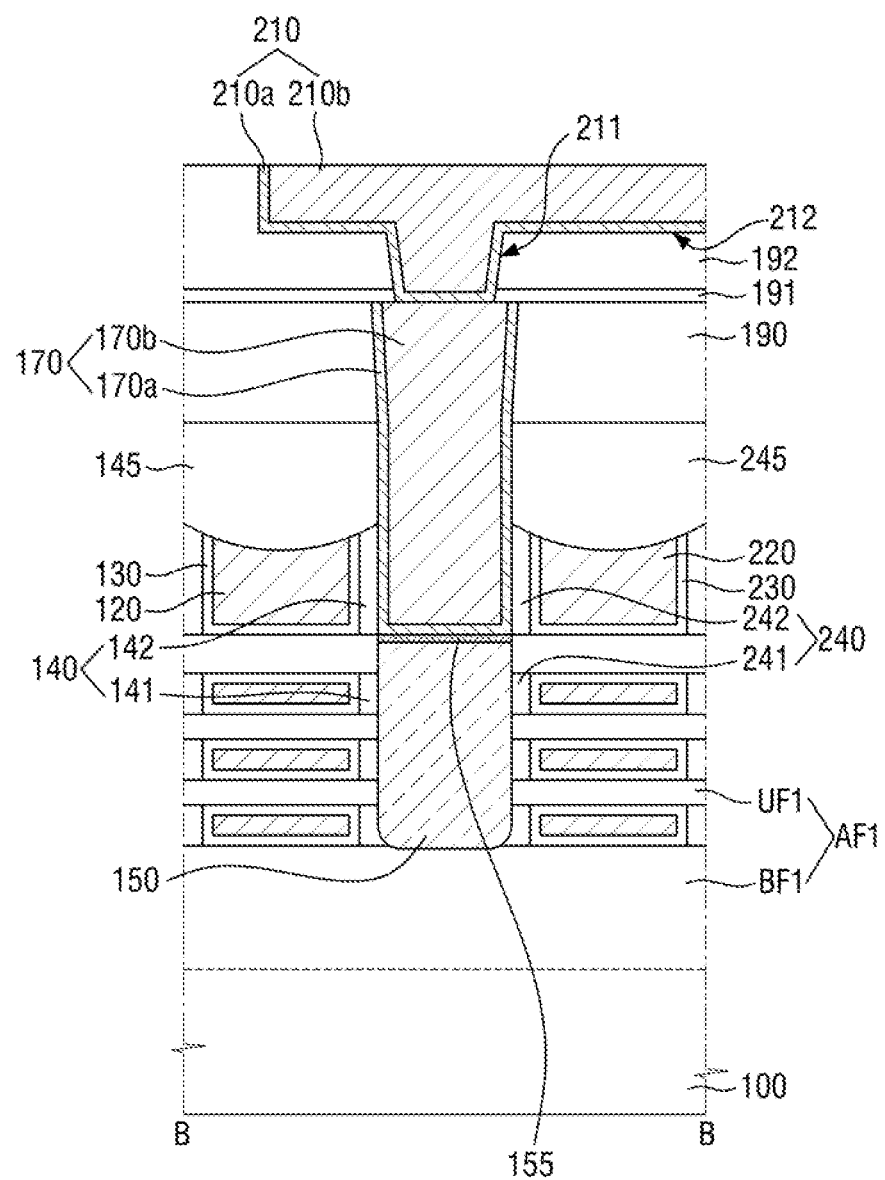
FIGS. 21A through 22 respectively illustrate semiconductor devices according to exemplary embodiments of the present disclosure.
Figure 21B:
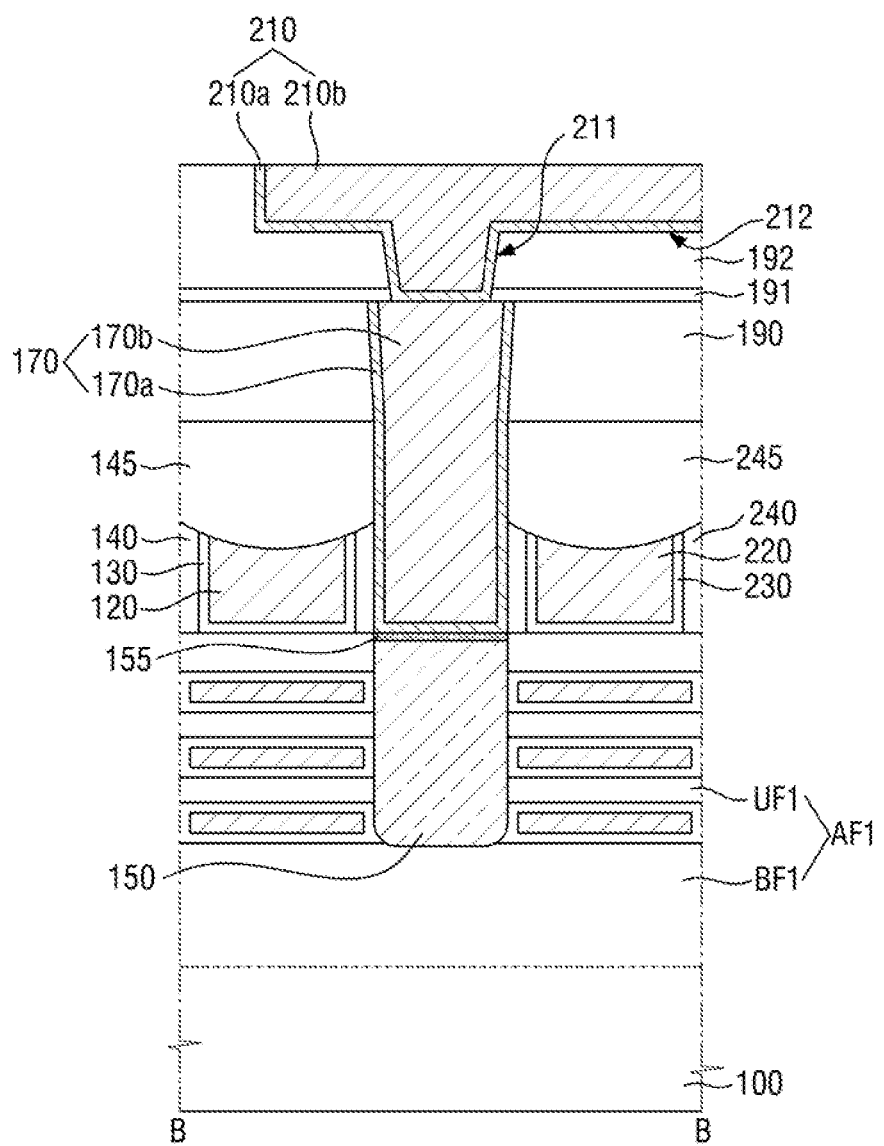
Figure 22:
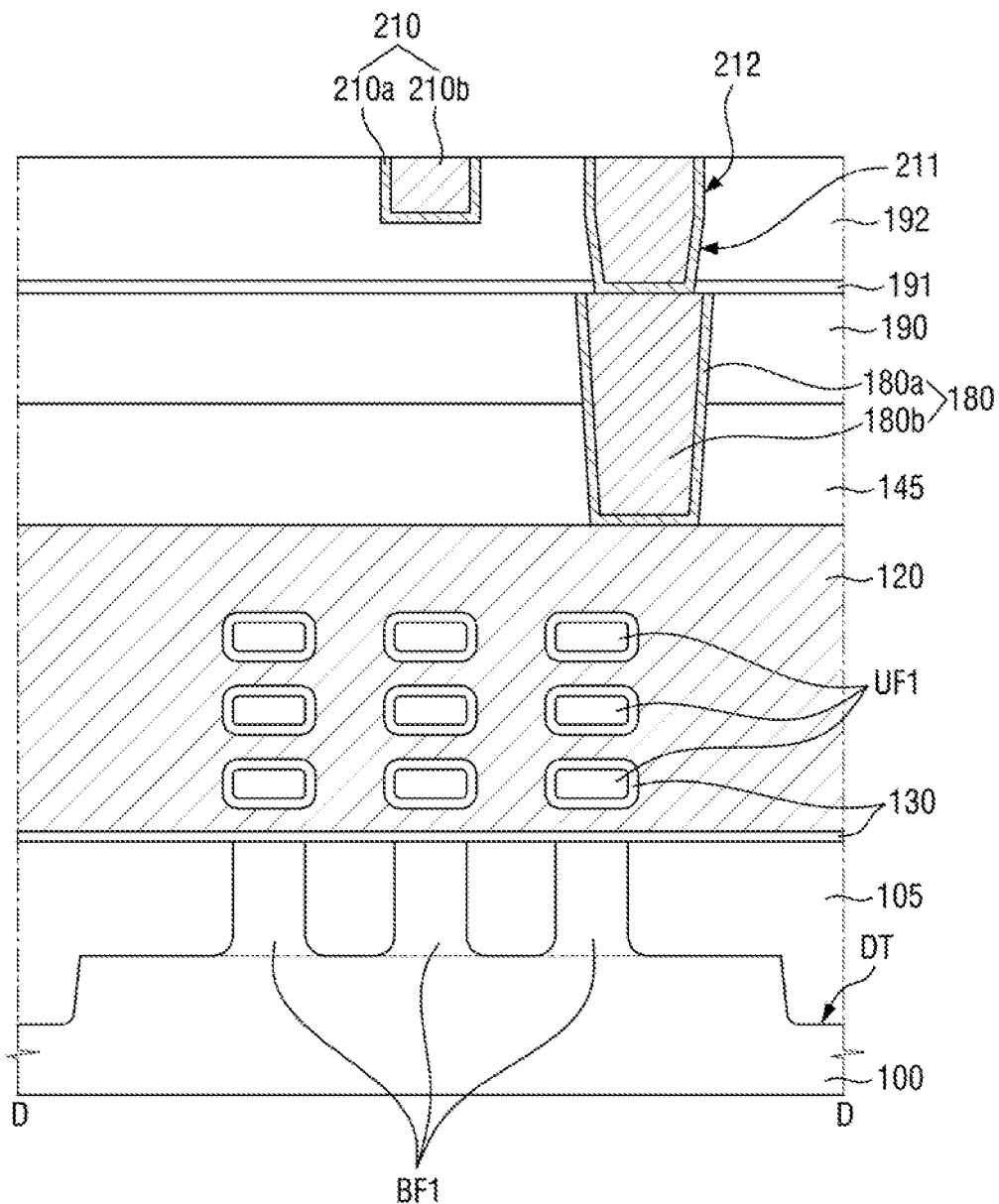

FIGS. 21A through 22 respectively illustrate semiconductor devices according to exemplary embodiments of the present disclosure. For ease of description, differences from the semiconductor device described above with reference to FIGS. 1 through 6 will be mainly described. It will be understood that to the extent that certain details are not described with respect to what is shown in FIGS. 21A through 22, these omitted details may be at least similar to the details for corresponding elements that have been described above with respect to FIGS. 1 through 6.

Referring to FIGS. 1 and 21A through 22, in semiconductor devices, according to exemplary embodiments of the present disclosure, a first active pattern AF1 may include a lower pattern BF1 and upper patterns UF1.

The lower pattern BF1 may extend in the first direction X1. The lower pattern BF1 may be fin-shaped. The upper patterns UF1 may be disposed on the lower pattern BF1 and spaced apart from the lower pattern BF1. The upper patterns UF1 may be spaced apart from each other in the first direction X1. Although three upper patterns UF1 are illustrated, this is merely an example used for ease of description, and the present invention is not limited to this example. The upper patterns UF1 may be connected to a source/drain pattern 150. The upper patterns UF1 may be channel patterns used as channel regions of transistors.

Each of a first gate electrode 120 and a second gate electrode 220 may at least partially surround the upper patterns UF1. The first gate electrode 120 and the second gate electrode 220 may be disposed between the upper patterns UF1 spaced apart from each other in a thickness direction of a substrate 100. Each of a first gate insulating layer 130 and a second gate insulating layer 230 may at least partially surround the upper patterns UF1.

In FIG. 21A, first gate spacers 140 may include first inner spacers 141 and first outer spacers 142. Second gate spacers 240 may include second inner spacers 241 and second outer spacers 242.

In FIG. 21B, unlike in FIG. 21A, inner spacers are omitted from the first gate spacers 140 and the second gate spacers 240.

Figure 23:
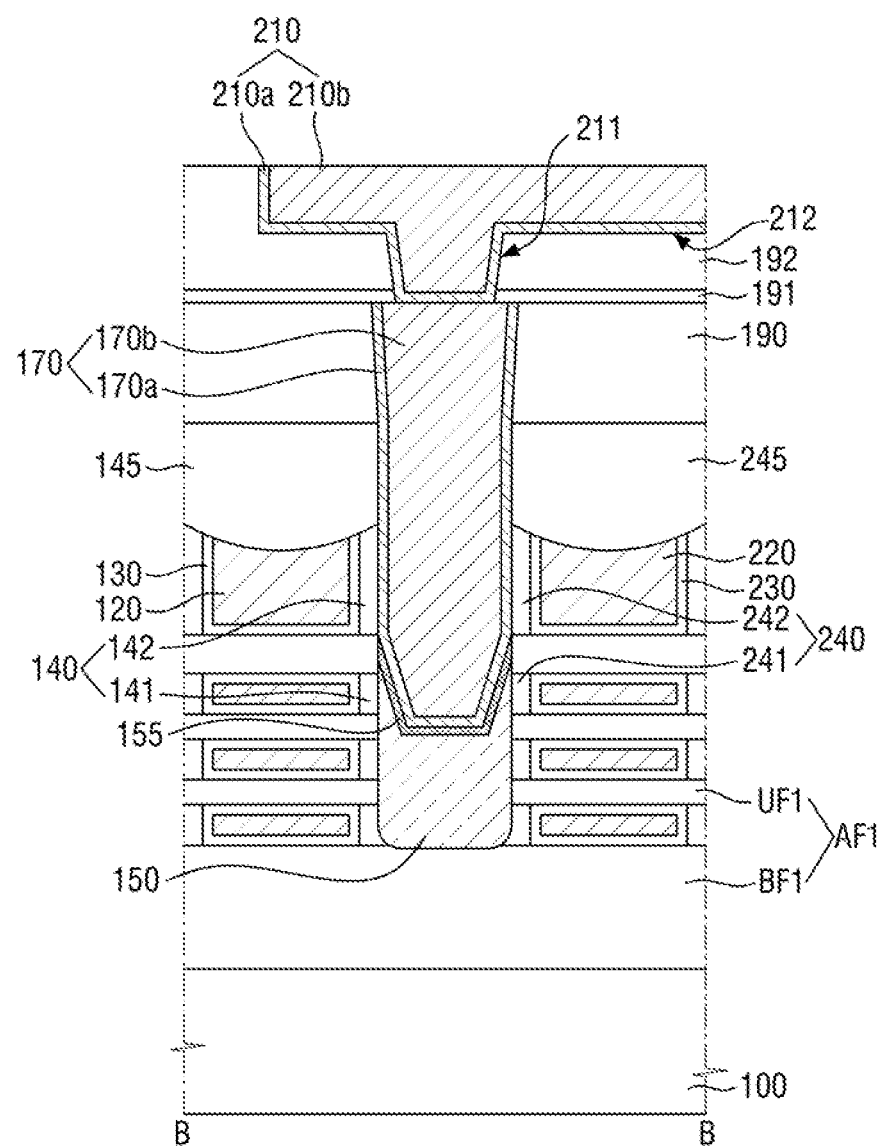
FIG. 23 illustrates a semiconductor device according to exemplary embodiments of the present disclosure.

FIG. 23 illustrates a semiconductor device according to exemplary embodiments of the present disclosure. For ease of description, differences from the semiconductor device described above with reference to FIGS. 21A and 22 will be mainly described. It will be understood that to the extent that certain details are not described with respect to what is shown in FIG. 23, these omitted details may be at least similar to the details for corresponding elements that have been described above with respect to FIGS. 21A through 22.

Referring to FIG. 23, a portion of a first source/drain contact 170 may be inserted into a source/drain pattern 150.

A silicide layer 155 may be formed between the source/drain pattern 150 and the first source/drain contact 170 inserted into the source/drain pattern 150. A bottom surface of the first source/drain contact 170 may be located between an upper surface of a lowermost upper pattern UF1 among a plurality of upper patterns UF1 and a lower surface of an uppermost upper pattern UF1.

Figure 24:
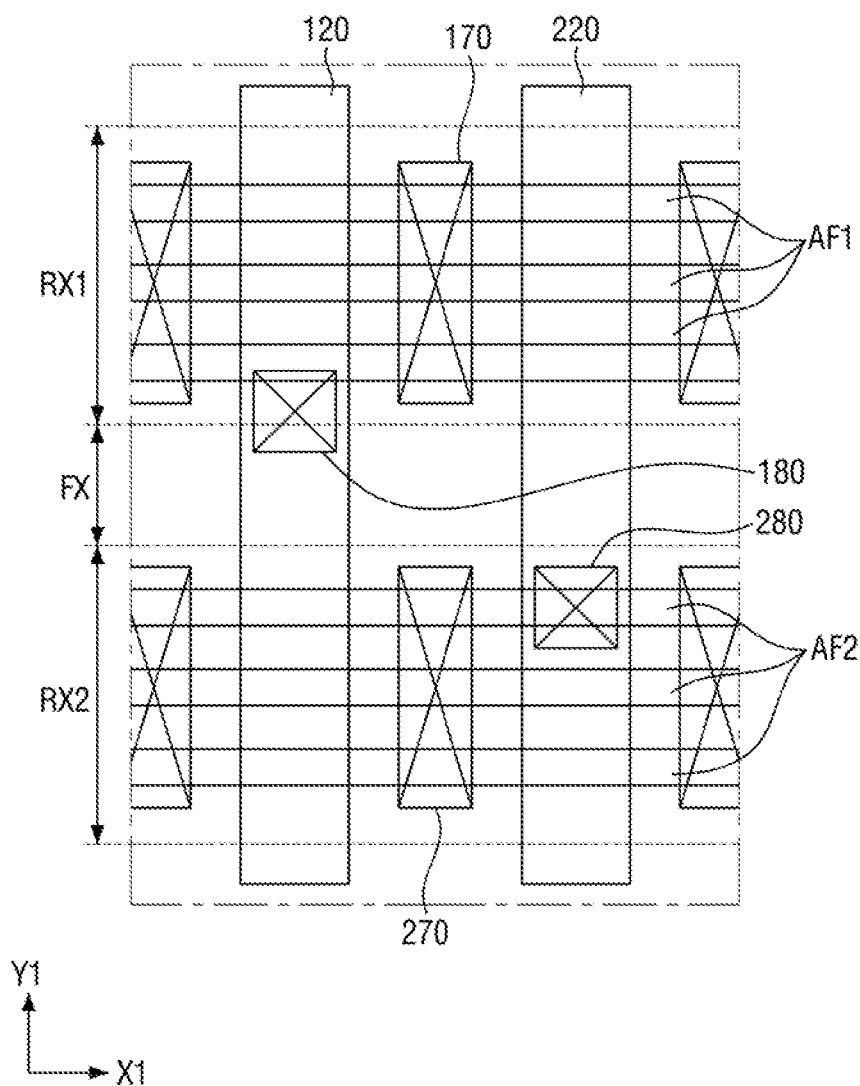
FIGS. 24 and 25 are respectively layout views of semiconductor devices according to exemplary embodiments of the present disclosure.
Figure 25:
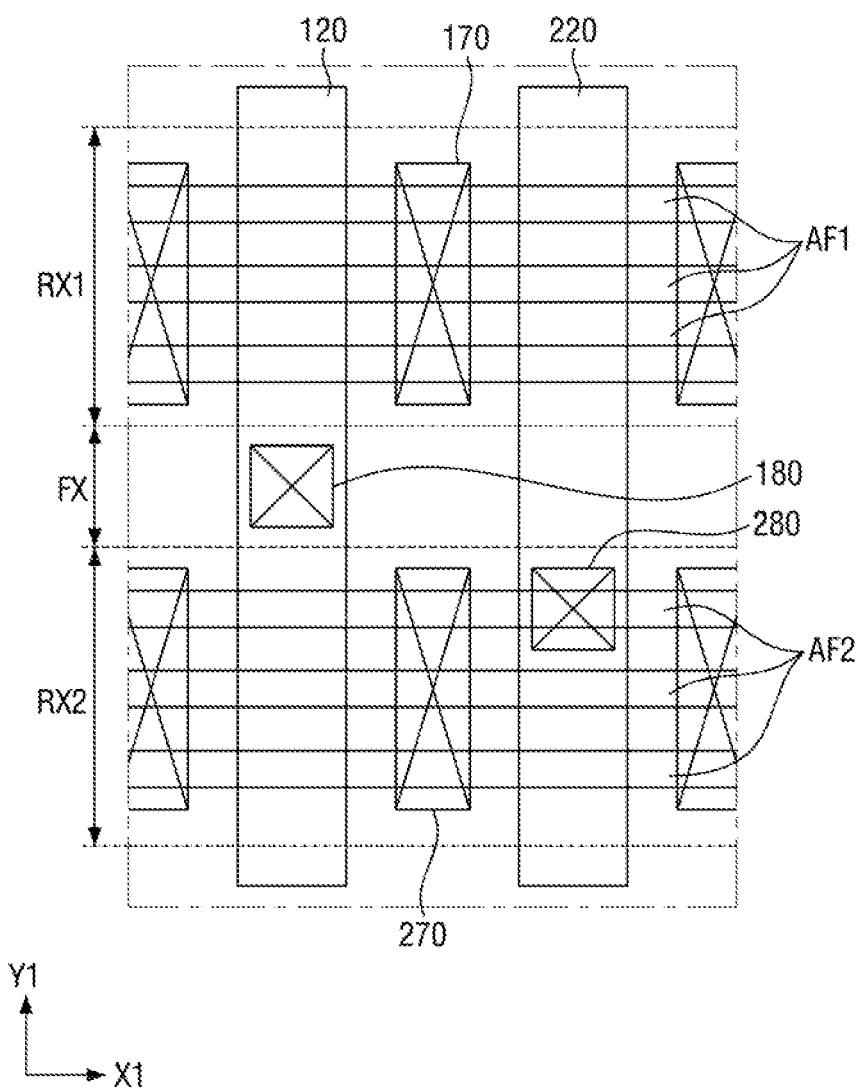

FIGS. 24 and 25 are respectively layout views of semiconductor devices according to exemplary embodiments of the present disclosure. For ease of description, differences from the semiconductor device described above with reference to FIGS. 1 through 6 will be mainly described. It will be understood that to the extent that certain details are not described with respect to what is shown in FIGS. 24 and 25, these omitted details may be at least similar to the details for corresponding elements that have been described above with respect to FIGS. 24 through 25.

Referring to FIG. 24, in a semiconductor device according to exemplary embodiments of the present disclosure, a first gate contact 180 may be disposed over a first active area RX1 and a field area FX.

A portion of the first gate contact 180 may be disposed at a position overlapping the first active area RX1.

Referring to FIG. 25, in a semiconductor according to exemplary embodiments of the present disclosure, the whole of a first gate contact 180 may be disposed on a field area FX.

The whole of the first gate contact 180 may be disposed at a position overlapping the field area FX.

Although an entirety of a second gate contact 280 is disposed in a second active area RX2 in FIGS. 24 and 25, exemplary embodiments are not limited to this case. A portion of the second gate contact 280 may also be disposed in the field area FX, or the whole of the second gate contact 280 may be disposed on the field area FX.

In FIGS. 1, 24 and 25, a cross section (taken in the second direction Y1) of a first source/drain contact 170 and a cross section of a second source/drain contact 270 may have a "T" shape rotated 180 degrees or an "L" shape depending on the positions of the first gate contact 180 and the second gate contact 280, respectively. The "T" shape and the "L" shape may be formed by etching a certain portion using a fabrication method to be described later. Alternatively, a source/drain contact with no gate contact around might not have an etched portion, like a pre-source/drain contact 170p illustrated in FIG. 27.

FIGS. 26 through 35 are views illustrating operations in a method of fabricating a semiconductor device according to exemplary embodiments of the present disclosure.

Figure 26:
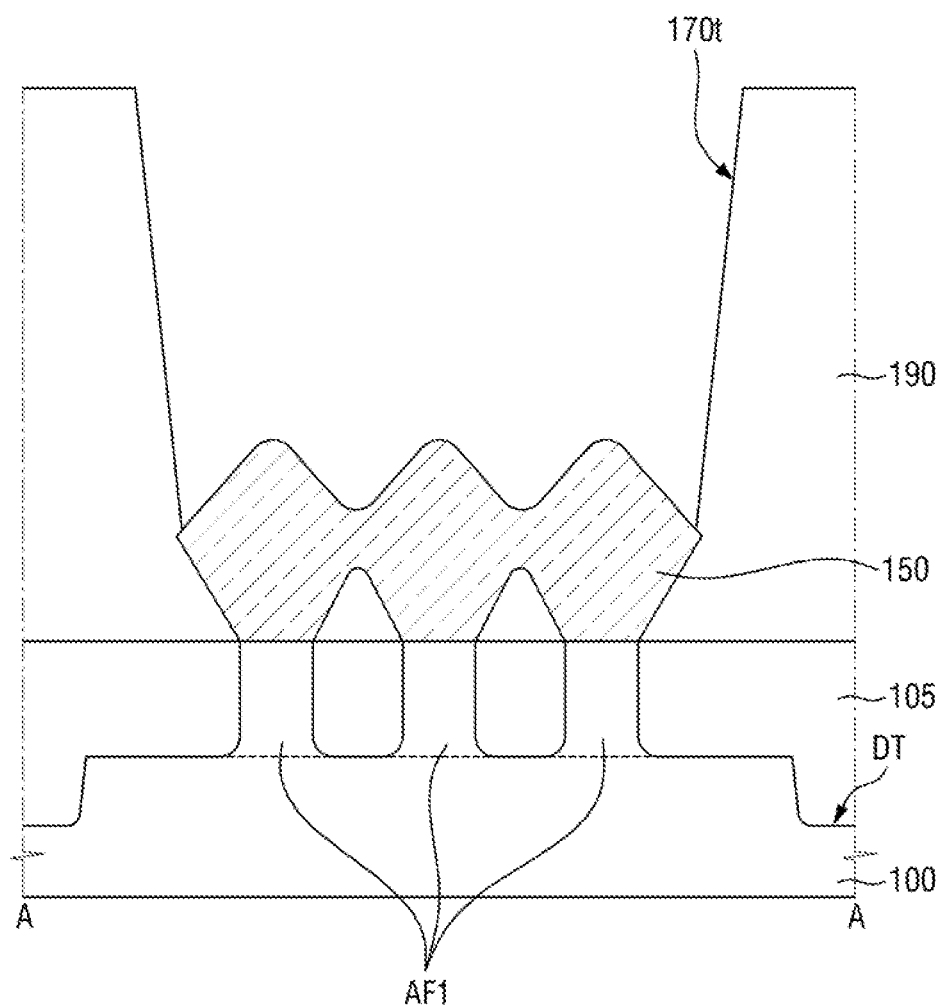
FIGS. 26 through 35 are cross-sectional views illustrating operations in a method of fabricating a semiconductor device according to exemplary embodiments of the present disclosure.
Figure 27:
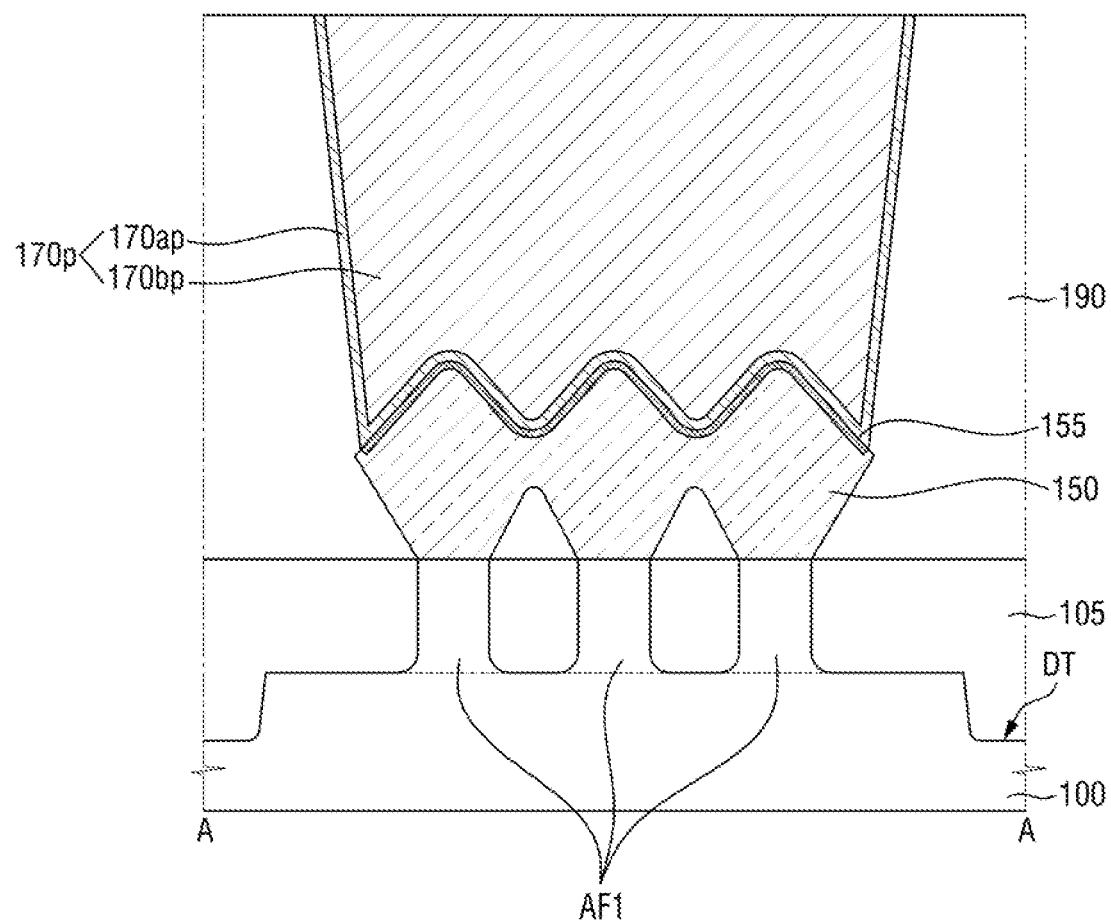

Referring to FIGS. 26 and 27, a source/drain pattern 150 connected to first active patterns AF1 is formed on a substrate 100.

A first interlayer insulating film 190 is formed on a field insulating layer 105 to cover the source/drain pattern 150. A pre-contact trench 170t may be formed in the first interlayer insulating film 190.

The pre-contact trench 170t may expose at least a portion of the source/drain pattern 150.

Next, a pre-source/drain contact 170p may be formed to fill the pre-contact trench 170t. The pre-source/drain contact 170p may include a pre-contact barrier layer 170ap and a pre-contact filling layer 170bp disposed on the pre-contact barrier layer 170ap.

The pre-contact barrier layer 170ap may extend along sidewalls of the pre-contact trench 170t and the source/drain pattern 150. The pre-contact filling layer 170bp may fill the pre-contact trench 170t in which the pre-contact barrier layer 170ap is formed.

A silicide layer 155 may be formed between the pre-source/drain contact 170p and the source/drain pattern 150. The silicide layer 155 may be formed before the formation of the pre-source/drain contact 170p, but the present invention is not limited to this case.

Figure 28:
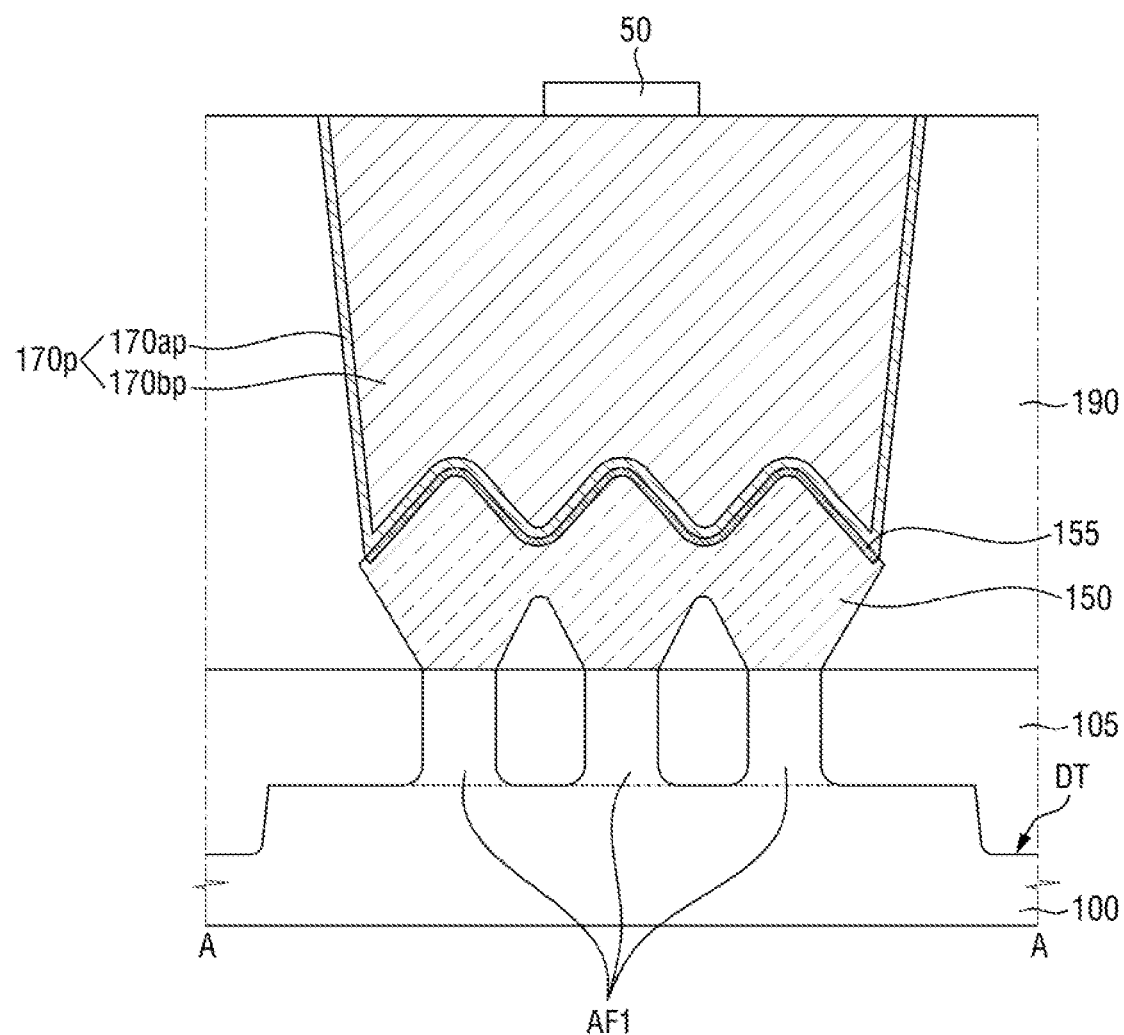

Referring to FIG. 28, a mask pattern 50 is formed on the pre-source/drain contact 170p.

The mask pattern 50 exposes a portion of the pre-source/drain contact 170p.

Figure 29:
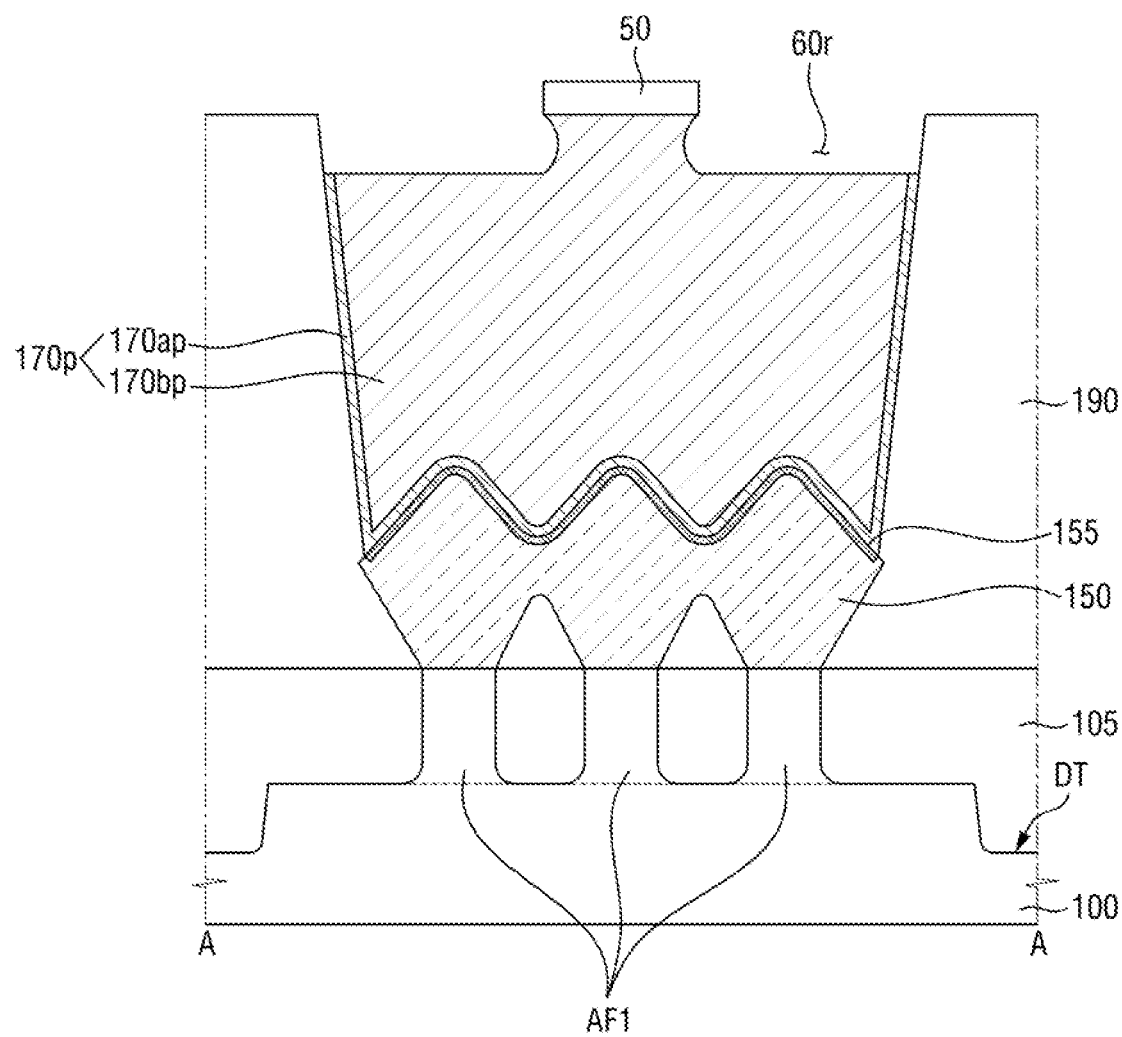

Referring to FIG. 29, the pre-source/drain contact 170p is removed using the mask pattern 50 to form first sub-recesses 60r in the pre-source/drain contact 170.

A bottom surface of each of the first sub-recesses 60r and a sidewall of each of the first sub-recesses 60r may be defined by the pre-source/drain contact 170p. The other sidewall of each of the first sub-recesses 60r may be defined by the first interlayer insulating film 190.

The first sub-recesses 60r may be formed using, for example, a wet-etching process.

The sidewall of each first sub-recess 60r defined by the pre-source/drain contact 170p may be curved, for example, concave.

Figure 30:
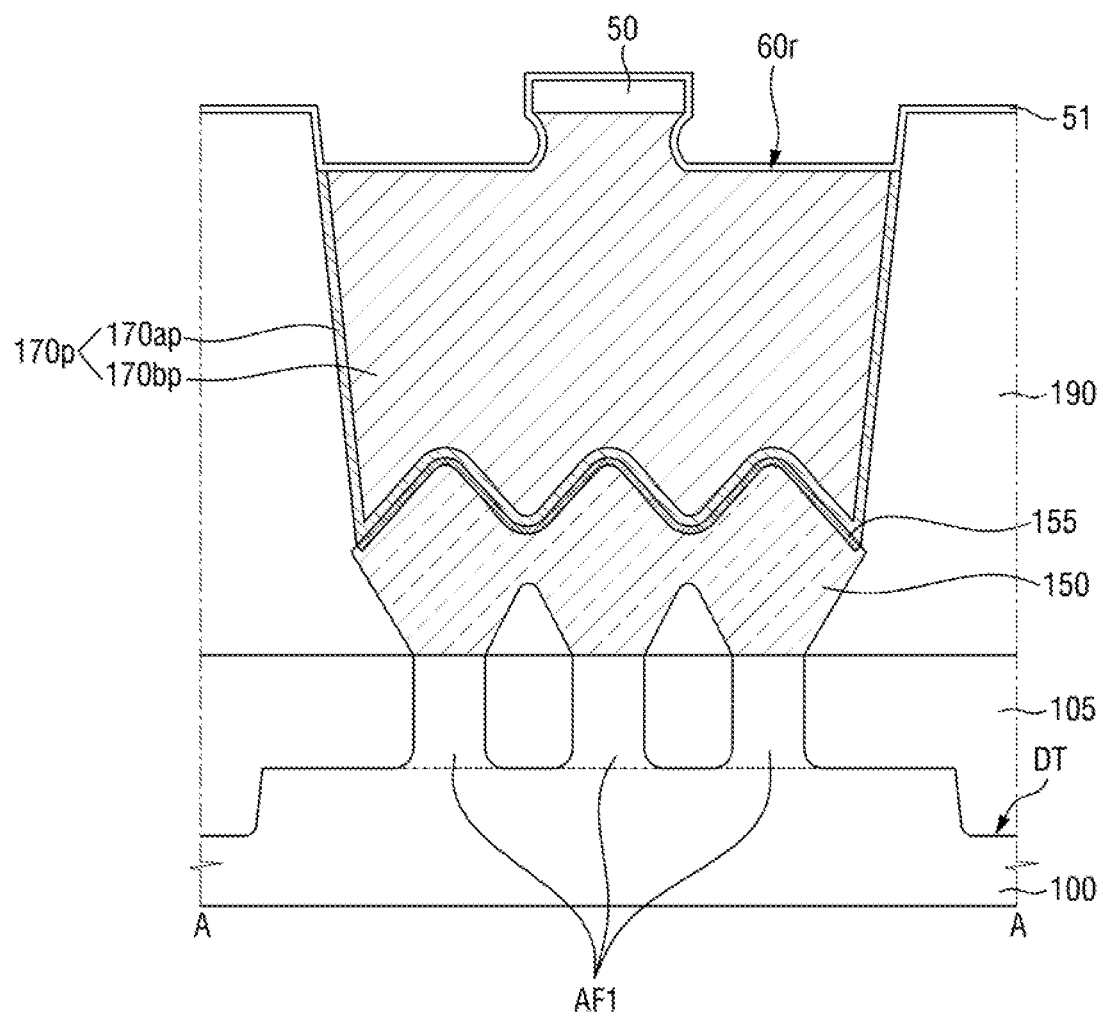

Referring to FIG. 30, a first sub-insulating liner 51 may be formed along the sidewalls and bottom surfaces of the first sub-recesses 60r.

The first sub-insulating liner 51 may also be formed on an upper surface of the mask pattern 50 and an upper surface of the first interlayer insulating film 190.

Figure 31:
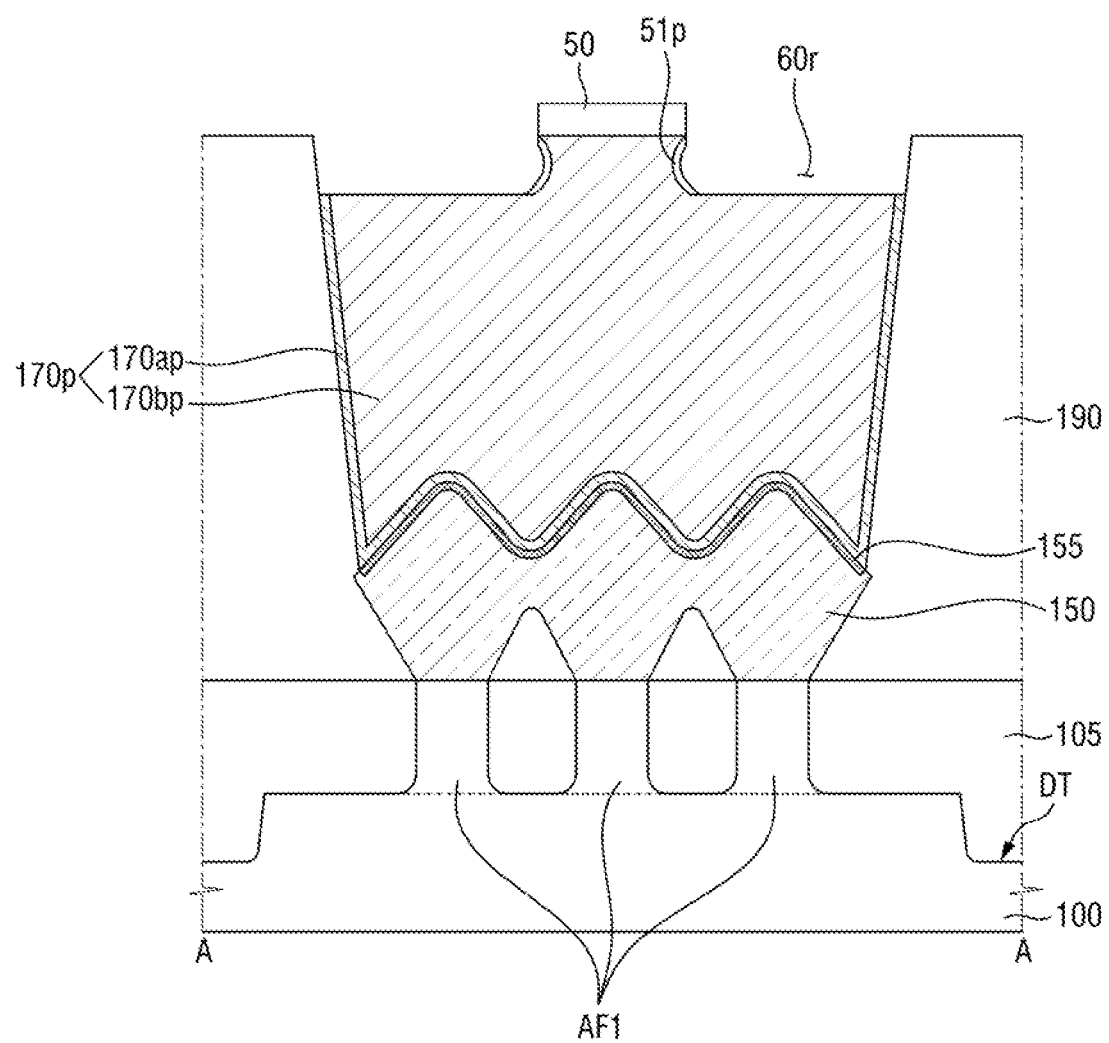

Referring to FIG. 31, a first insulating liner pattern 51p may be formed on the sidewall of each first sub-recess 60r by anisotropically etching the first sub-insulating liner 51.

The bottom surfaces of the first sub-recesses 60r are exposed during the anisotropic etching of the first sub-insulating liner 51.

The first insulating liner pattern 51p is formed on the sidewall of each first sub-recess 60r defined by the pre-source/drain contact 170p.

Figure 32:
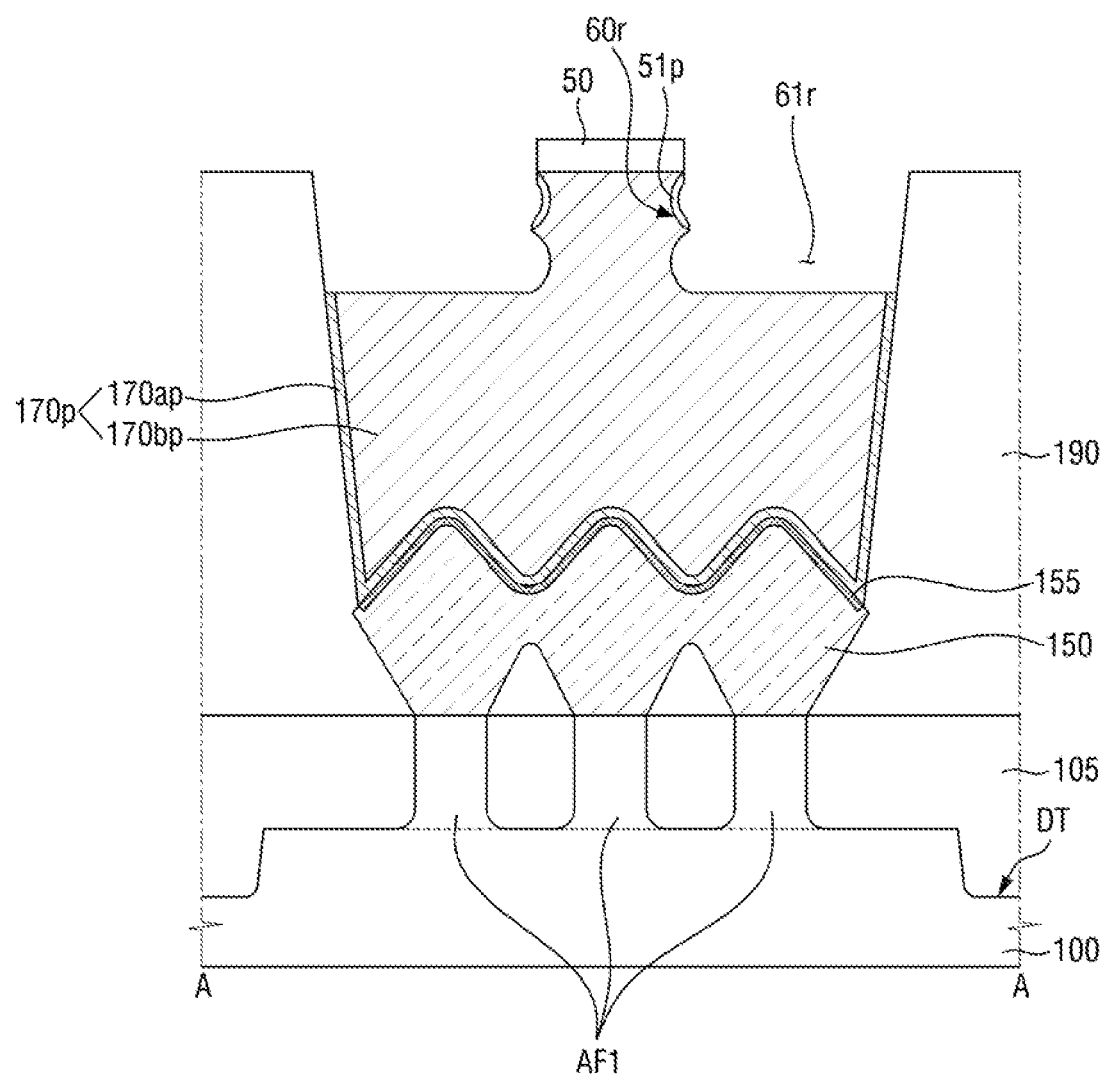

Referring to FIG. 32, the pre-source/drain contact 170p is removed using the mask pattern 50 and the first insulating liner pattern 51p to form second sub-recesses 61r in the pre-source/drain contact 170.

A bottom surface of each of the second sub-recesses 61r and a sidewall of each of the second sub-recesses 61r may be defined by the pre-source/drain contact 170p. The other sidewall of each of the second sub-recesses 61r may be defined by the first interlayer insulating film 190.

The second sub-recesses 61r may be formed using, for example, a wet-etching process.

Figure 33:
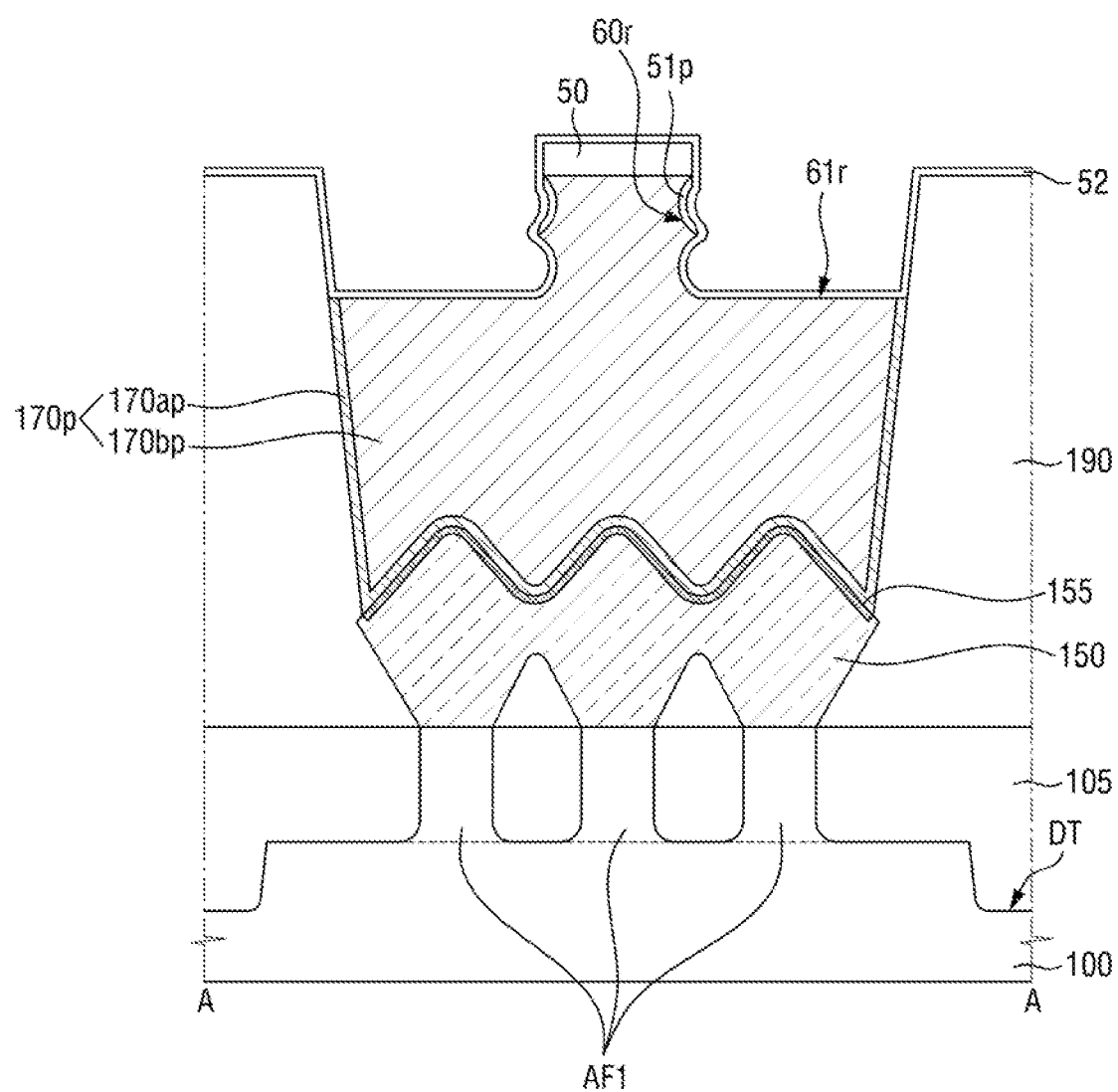

Referring to FIG. 33, a second sub-insulating liner 52 may be formed along the sidewalls and bottom surfaces of the second sub-recesses 61r.

The second sub-insulating liner 51 may also be formed on the upper surface of the mask pattern 50, the upper surface of the first interlayer insulating film 190, and the first insulating liner pattern 51p.

Figure 34:
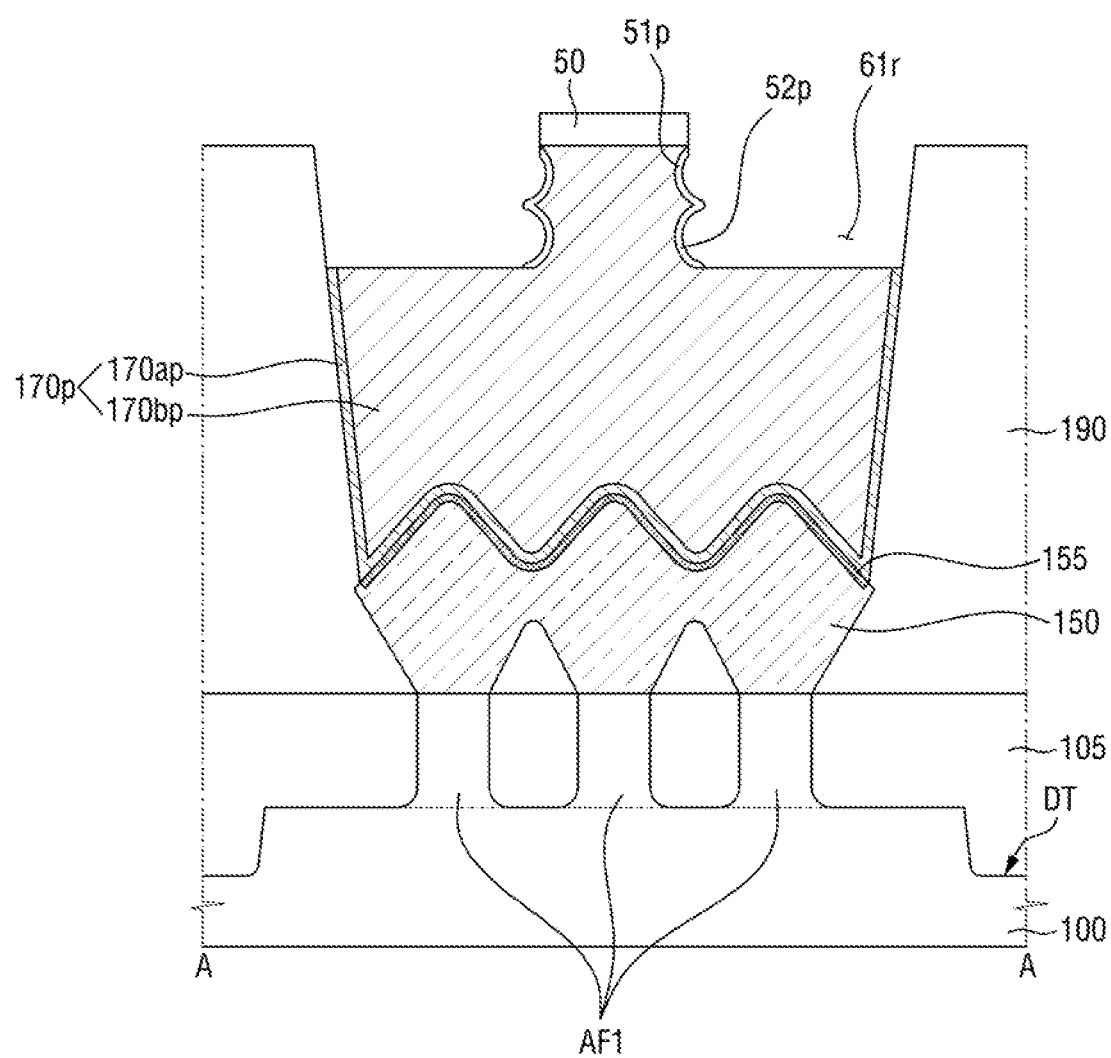

Referring to FIG. 34, a second insulating liner pattern 52p may be formed on the sidewall of each second sub-recess 61r by anisotropically etching the second sub-insulating liner 52.

The second insulating liner pattern 52p is formed on the sidewall of each second sub-recess 61r defined by the pre-source/drain contact 170p.

The first insulating liner pattern 51p may include a portion of the second sub-insulating liner 52.

The bottom surfaces of the second sub-recesses 61r are exposed during the anisotropic etching of the second sub-insulating liner 52.

Figure 35:
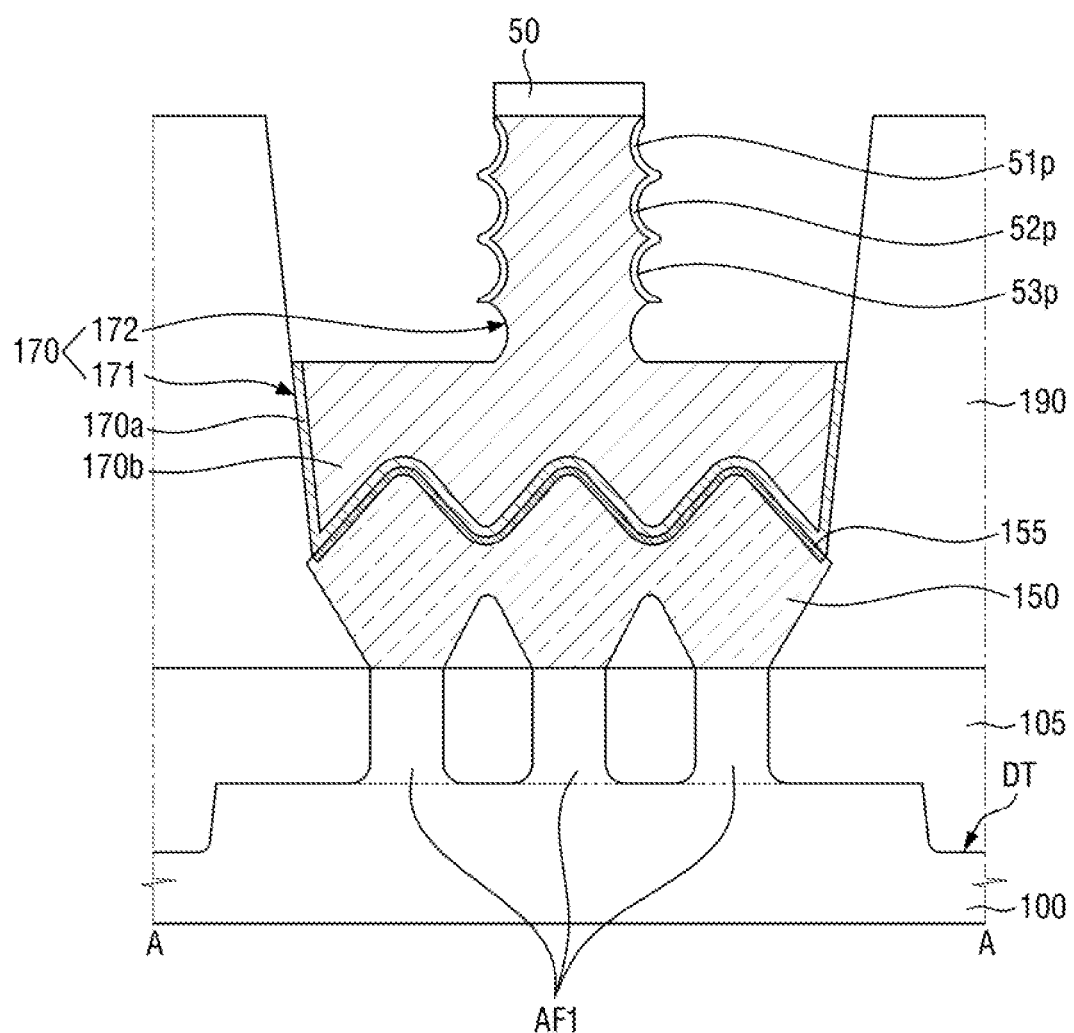

Referring to FIG. 35, a first source/drain contact 170 including an upper contact structure 172 and a lower contact structure 171 may be formed on the source/drain pattern 150 by repeating the processes described above with respect to FIGS. 32 through 34.

The first through third insulating liner patterns 51p through 53p may be formed on sidewalls of the upper contact structure 172.

For example, if the first interlayer insulating film 190 covering the first through third insulating liner patterns 51p through 53p is additionally formed, the first through third insulating liner patterns 51p through 53p may become the contact insulating liner 175 of FIG. 8.

For example, the first interlayer insulating film 190 may be additionally formed after the first through third insulating liner patterns 51p through 53p are removed. In this case, the resultant structure may be as illustrated in FIG. 9.

For example, if the first interlayer insulating film 190 is additionally formed after the fabrication processes described in FIGS. 33 and 34, the contact insulating liner 175 of FIG. 2 may be formed.

For example, if the first interlayer insulating film 190 is additionally formed after the fabrication process described in FIG. 33, the contact insulating liner 175 of FIG. 7 may be formed.

Next, the mask pattern 50 is removed.

In concluding the detailed description, those skilled in the art will appreciate that many variations and modifications may be made to the discussed exemplary embodiments without substantially departing from the principles of the present disclosure.

What is claimed is:
1. A semiconductor device, comprising:
a substrate;
a source/drain pattern disposed on the substrate; and
a source/drain contact connected to the source/drain pattern,
wherein the source/drain contact comprises a lower contact structure extending in a first direction and an upper contact structure protruding from the lower contact structure,
wherein the upper contact structure comprises a first sidewall and a second sidewall facing away from each other in the first direction,
wherein the first sidewall of the upper contact structure comprises a plurality of first sub-sidewalls, and wherein each of the first sub-sidewalls has a concave surface with respect to an interior of the upper contact structure, and wherein an acute angle is formed between an upper surface of the upper contact structure and a topmost concave surface of the first sub-sidewalls.

2. The semiconductor device of claim 1, further comprising a contact insulating liner extending along the first sidewall of the upper contact structure.

3. The semiconductor device of claim 2, wherein the contact insulating liner does not extend along an upper surface of the lower contact structure.

4. The semiconductor device of claim 1, wherein the second sidewall of the upper contact structure comprises a plurality of second sub-sidewalls, and each of the second sub-sidewalls has a concave surface.

5. The semiconductor device of claim 4, wherein there is an equal number of the first sub-sidewalls and the second sub-sidewalls.

6. The semiconductor device of claim 1, further comprising an interlayer insulating film which at least partially surrounds the upper contact structure and exposes the upper surface of the upper contact structure, wherein the interlayer insulating layer contacts the upper contact structure.

7. The semiconductor device of claim 1, wherein the upper contact structure comprises one or more apex parts, and each of the one or more apex parts is defined where the adjacent first sub-sidewalls meet.

8. The semiconductor device of claim 1. wherein the source/drain contact is L-shaped.

9. The semiconductor device of claim 1, at a boundary between the lower contact structure and the upper structure, a width of the lower contact structure in a second direction is greater than a width of the upper contact structure in the second direction.

10. The semiconductor device of claim 1, wherein the source/drain contact has T-shaped rotated 180 degrees.

11. A semiconductor device, comprising:
a substrate,
a source/drain pattern disposed on the substrate; and
a source/drain contact connected to the source/drain pattern,
wherein the source/drain contact comprises a lower contact structure extending in a first direction and an upper contact structure protruding from the lower contact structure, wherein the upper contact structure comprises a first sidewall and a second sidewall facing away from each other in the first direction, wherein the first sidewall of the upper contact structure comprises a plurality of first sub-sidewalls, wherein each of the first sub-sidewalls has a concave surface, wherein the semiconductor device further comprises a contact insulating liner extending along the first sidewall of the upper contact structure, and wherein the contact insulating liner comprises a first portion extending along the upper surface of the lower contact structure, a second portion extending from a first end of the first portion of the contact insulating liner and along the first sidewall of the upper contact structure, and a third portion extending in a direction away from the lower contact structure from a second end of the first portion of the contact insulating liner.

12. A semiconductor device, comprising:
a substrate;
a source/drain pattern disposed on the substrate; and
a source/drain contact connected to the source/drain pattern,
wherein the source/drain contact comprises a lower contact structure extending in a first direction and an upper contact structure protruding from the lower contact structure wherein the upper contact structure comprises a first sidewall and a secondsidewall facing away from each other in the first direction, wherein the first sidewall of the upper contact structure comprises a plurality of first sub-sidewalls, wherein each of the first sub-sidewal s has a. concave surface, wherein the semiconductor device further comprises a contact insulating liner extending along the first sidewall of the upper contact structure, and wherein the first sub-sidewalls comprise a first sub-lower sidewall and a first sub-upper sidewall disposed on the first sub-lower sidewall, and the contact insulating liner is disposed on the first sub-upper sidewall and is not disposed on the first sub-lower sidewall.

\* \* \* \* \*